(12) United States Patent
Maeda et al.

(10) Patent No.: US 9,536,881 B2
(45) Date of Patent: Jan. 3, 2017

(54) SEMICONDUCTOR DEVICES HAVING FIN SHAPED CHANNELS

(71) Applicants: Shigenobu Maeda, Seongnam-si (KR); Sung-Bong Kim, Suwon-si (KR); Chang-Wook Moon, Seoul (KR); Dong-Hun Lee, Anyang-si (KR); Hyung-Soon Jang, Hwaseong-si (KR); Sang-Pil Sim, Seongnam-si (KR)

(72) Inventors: Shigenobu Maeda, Seongnam-si (KR); Sung-Bong Kim, Suwon-si (KR); Chang-Wook Moon, Seoul (KR); Dong-Hun Lee, Anyang-si (KR); Hyung-Soon Jang, Hwaseong-si (KR); Sang-Pil Sim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 125 days.

(21) Appl. No.: 14/259,912

(22) Filed: Apr. 23, 2014

(65) Prior Publication Data
US 2014/0312427 A1    Oct. 23, 2014

(30) Foreign Application Priority Data
Apr. 23, 2013  (KR) .................. 10-2013-0045022

(51) Int. Cl.
| H01L 27/11 | (2006.01) |
| H01L 27/092 | (2006.01) |
| H01L 27/02 | (2006.01) |
| H01L 21/8238 | (2006.01) |

(52) U.S. Cl.
CPC ... *H01L 27/0924* (2013.01); *H01L 21/823807* (2013.01); *H01L 21/823814* (2013.01); *H01L 21/823821* (2013.01); *H01L 27/0207* (2013.01); *H01L 27/1108* (2013.01)

(58) Field of Classification Search
CPC .......... H01L 21/823431; H01L 21/845; H01L 27/1089; H01L 29/41791; H01L 29/7855; H01L 27/0886; H01L 21/823821; H01L 27/0924; H01L 27/0879; H01L 27/1211; H01L 29/66795; H01L 29/7831
USPC ......... 257/288, 368, 369; 438/151, 197, 199
See application file for complete search history.

(56) References Cited

U.S. PATENT DOCUMENTS

| 7,880,235 B2 | 2/2011 | Saitoh |
| 8,153,493 B2 | 4/2012 | Lee |
| 8,264,021 B2 | 9/2012 | Lai et al. |
| 8,357,569 B2 | 1/2013 | Pawlak |
| 8,362,572 B2 | 1/2013 | Huang et al. |
| 8,362,574 B2 | 1/2013 | Kawasaki et al. |

(Continued)

FOREIGN PATENT DOCUMENTS

| JP | 4493343 | 4/2010 |
| JP | 4675585 | 2/2011 |

*Primary Examiner* — Jarrett Stark
*Assistant Examiner* — Shahed Ahmed
(74) *Attorney, Agent, or Firm* — Myers Bigel, P.A.

(57) ABSTRACT

Semiconductor devices are provided. The semiconductor devices include a first fin; a first gate electrode intersecting the first fin; a first elevated source and/or drain on respective sides of the first gate electrode on the first fin; and a first field dielectric film adjacent the first fin. The first field dielectric film includes a first part below a top surface of the first fin and a second part protruding from the first part and above a top surface of the first fin that makes contact with the first elevated source and/or drain.

10 Claims, 31 Drawing Sheets

(56) References Cited

U.S. PATENT DOCUMENTS

| | | | |
|---|---|---|---|
| 8,586,449 B1* | 11/2013 | Chang | H01L 21/845 |
| | | | 257/296 |
| 8,586,455 B1* | 11/2013 | Chang | H01L 27/1104 |
| | | | 257/E21.545 |
| 2011/0195555 A1 | 8/2011 | Tsai et al. | |
| 2011/0291188 A1 | 12/2011 | Cheng et al. | |
| 2012/0276695 A1* | 11/2012 | Cheng | H01L 27/1211 |
| | | | 438/154 |
| 2012/0313177 A1 | 12/2012 | Chen et al. | |
| 2014/0001520 A1* | 1/2014 | Glass | H01L 29/66439 |
| | | | 257/288 |
| 2014/0239358 A1* | 8/2014 | Shah | H01L 29/42384 |
| | | | 257/288 |

* cited by examiner

SEMICONDUCTOR DEVICES HAVING FIN SHAPED CHANNELS

CROSS-REFERENCE TO RELATED APPLICATION

This application claims priority from Korean Patent Application No. 10-2013-0045022, filed on Apr. 23, 2013 in the Korean Intellectual Property Office, the contents of which are incorporated herein by reference as if set forth in its entirety.

FIELD

The present invention relates generally to a semiconductor device and, more particularly to semiconductor devices having fin shaped channels and related methods of fabricating the same.

BACKGROUND

As one of scaling techniques for increasing the density of integrated circuit devices, a multi-gate transistor has been proposed, in which a fin- or nanowire-shaped multi-channel active pattern (or silicon body) is formed on a substrate and a gate formed on a surface of the multi-channel active pattern.

Since the multi-gate transistor uses a three-dimensional (3D) channel, scaling of the multi-gate transistor is easily achieved. In addition, current controlling capability can be improved even without increasing a gate length of the multi-gate transistor. Further, a short channel effect (SCE), in which an electric potential of a channel region is affected by a drain voltage, can be effectively suppressed.

SUMMARY

Some embodiments of the present inventive concept provide a semiconductor device including a first fin, a first gate electrode formed to intersect the first fin, a first elevated source/drain formed at opposite sides of the first gate electrode on the first fin, and a first field dielectric film formed in vicinity of the first fin, wherein the first field dielectric film includes a first part lower than a top surface of the first fin and a second part protruding from the first part to be higher than a top surface of the first fin and making contact with the first elevated source/drain.

Further embodiments of the present inventive concept provide a semiconductor device including an SRAM device including a first fin type transistor and a second fin type transistor, and first field dielectric films formed in vicinity of the first fin type transistor and the second fin type transistor, wherein the first fin type transistor includes a first fin and a first elevated source/drain formed on the first fin, the second fin type transistor includes a second fin and a second elevated source/drain formed on the second fin, and the first field dielectric films are formed between the first elevated source/drain and the second elevated source/drain and include a first part lower than the first fin and a top surface of the second fin and a second part protruding from the first part and higher than the top surface of the second fin.

Still further embodiments of the present inventive concept provide a semiconductor device including a first fin to a fourth fin spaced apart from one another, a first gate electrode intersecting the first fin and the second fin, a second gate electrode intersecting the first fin, a third gate electrode intersecting the third fin and the fourth fin, a fourth gate electrode intersecting the fourth fin, first and second elevated sources/drains formed at opposite sides of the first gate electrode on the first fin, third to fifth elevated sources/drains disposed at one side of the first gate electrode, between the first gate electrode and the second gate electrode and at the other side of the second gate electrode, on the second fin, sixth and seventh elevated sources/drains disposed at opposite sides of the third gate electrode, on the third fin, eighth to tenth elevated sources/drains disposed at one side of the third gate electrode, between the third gate electrode and the fourth gate electrode and at the other side of the fourth gate electrode, on the fourth fin, and a raised field dielectric disposed between one and another among the first to tenth elevated sources/drains.

Some embodiments of the present inventive concept provide a semiconductor device including a substrate having a first region and a second region defined therein, a first elevated source/drain and a second elevated source/drain formed in the first region, and a field dielectric film disposed between the first and second elevated sources/drains and separating the first and second elevated sources/drains from each other, and a third elevated source/drain and a fourth elevated source/drain formed in the second region and making contact with each other.

Further embodiments of the present inventive concept provide a semiconductor device including a substrate having a first region and a second region defined therein, a first fin formed in the first region, a normal gate intersecting the first fin, an elevated source/drain disposed at opposite sides of the normal gate on the first fin, a first raised field dielectric film formed in vicinity of the first fin and making contact with the elevated source/drain, a second fin and a third fin formed in the second region, a second raised field dielectric film formed between the second fin and the third fin, and a dummy gate formed on the second raised field dielectric film.

BRIEF DESCRIPTION OF THE DRAWINGS

The above and other features and advantages of the present inventive concept will become more apparent by describing in detail embodiments thereof with reference to the attached drawings in which:

FIGS. 2 through 4A are cross sections taken along the lines A-A', B-B' and C-C', illustrating the semiconductor device according to embodiments of the present inventive concept.

FIG. 12B illustrates only a plurality of fins and a plurality of gate electrodes in the layout view of FIG. 12A.

DETAILED DESCRIPTION OF THE EMBODIMENTS

Figure 1:
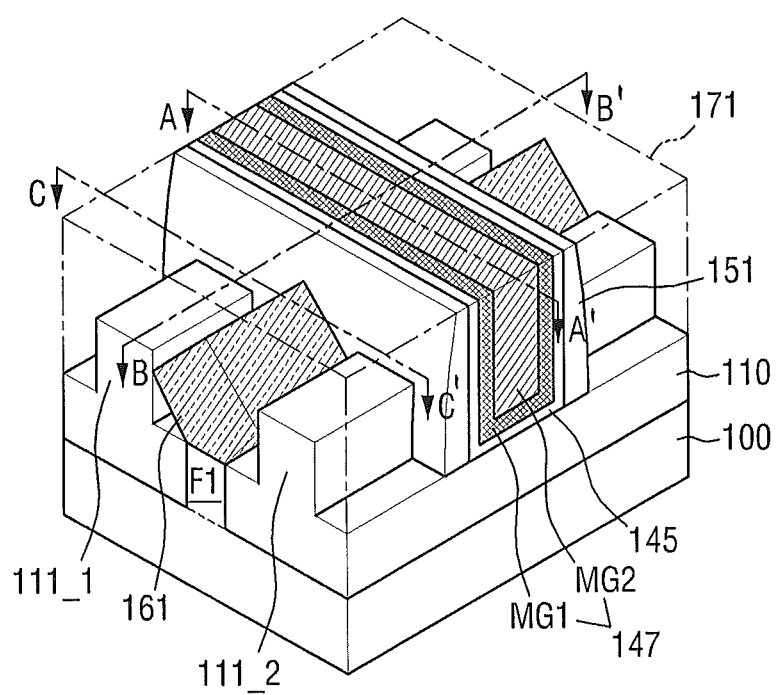
FIG. 1 is a perspective view of a semiconductor device according to some embodiments of the present inventive concept.
Figure 1:
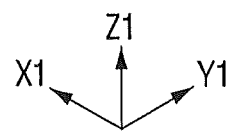

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views, cross sections, and/or plan views, in which embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 2:
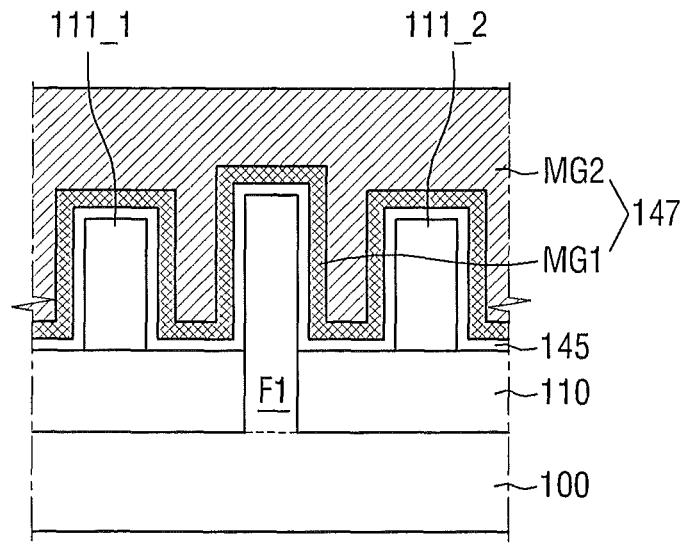
Figure 3:
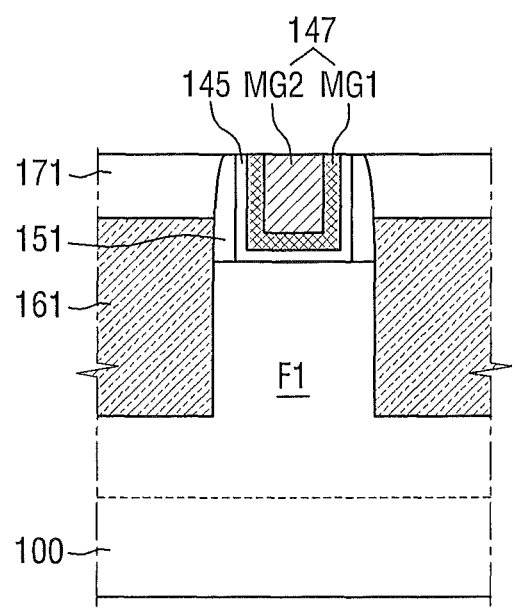
Figure 4A:
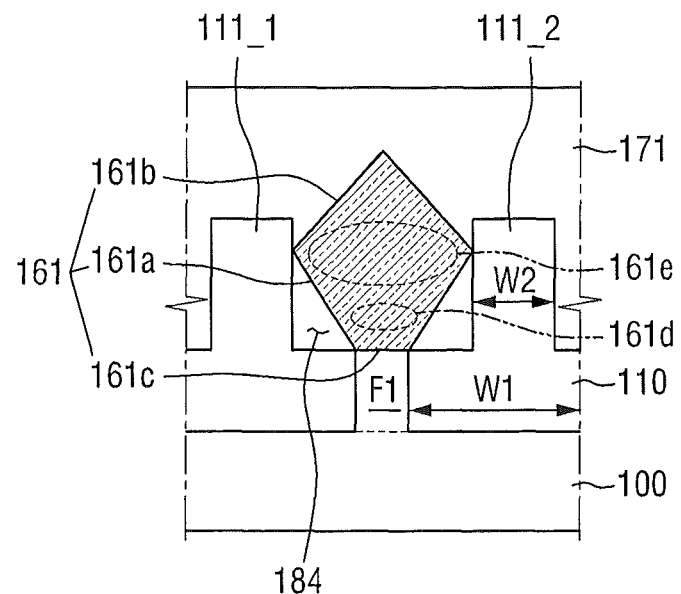
Figure 4B:
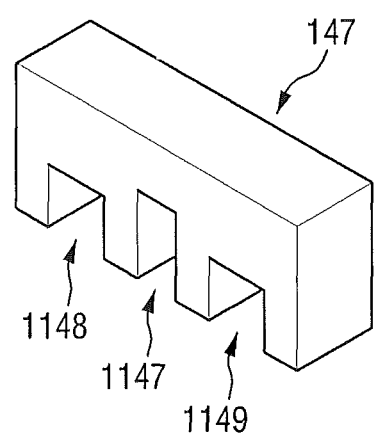
FIG. 4B is a conceptual diagram illustrating a first gate electrode of the semiconductor device illustrated in FIG. 1.

FIG. 1 is a perspective view of a semiconductor device according to some embodiments of the present inventive concept, FIGS. 2, 3 and 4A are cross sections taken along the lines A-A', B-B' and C-C', illustrating the semiconductor device according to some embodiments of the present inventive concept, and FIG. 4B is a conceptual diagram illustrating a first gate electrode of the semiconductor device shown in FIG. 1.

Referring first to FIGS. 1 to 4A, the semiconductor device 1 according to the some embodiments of the present inventive concept may include a substrate 100, a first fin F1, first field dielectric films 110, 111_1 and 111_2, a first gate electrode 147, a first elevated source/drain 161, and an interlayer insulating film 171.

The substrate 100 may be made of one or more semiconductor materials selected from the group consisting of, for example, Si, Ge, SiGe, GaP, GaAs, SiC, SiGeC, InAs and InP. Furthermore, in some embodiments the substrate 100 may be a silicon on insulator (SOI) substrate.

The fin F1 may extend lengthwise in a second direction Y1. The fin F1 may be a portion of a substrate 100, and may include an epitaxial layer grown from the substrate 100. The first field dielectric films 110, 111_1 and 111_2 may be formed in vicinity of the fin F1.

The first gate electrode 147 may be formed on the fin F1 to intersect the fin F1. The first gate electrode 147 may extend in a first direction X1. The first gate electrode 147 may include metal layers MG1 and MG2. As illustrated, the first gate electrode 147 may include two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, TaN, TiC, and TaC. Furthermore, the second metal layer MG2 may include W or Al. Alternatively, the first gate electrode 147 may include a material other than a metal, such as Si or SiGe. In some embodiments, the first gate electrode 147 may be formed by, for example, a replacement process, however, embodiments of the present inventive concept are not limited thereto.

A first gate electrode insulating film 145 may be formed between the fin F1 and the first gate electrode 147. As illustrated in FIG. 2, the first gate electrode insulating film 145 may be formed on a top surface and upper portions of lateral surfaces of the fin F1. In addition, the first gate electrode insulating film 145 may be disposed between the first gate electrode 147 and the first field dielectric film 110. The first gate electrode insulating film 145 may include a high-k dielectric material having a higher dielectric constant than a silicon oxide film. For example, the first gate electrode insulating film 145 may include $HfO_2$, $ZrO_2$ or $Ta_2O_5$. The spacer 151 may include at least one of a nitride film and an oxynitride film.

The first elevated source/drain 161 may be disposed at opposite sides of the first gate electrode 147 and on the fin F1. The first elevated source/drain 161 may be an epitaxial layer. In other words, the first elevated source/drain 161 may be an epitaxial layer.

The first elevated source/drain 161 may have various shapes without departing from the scope of the present inventive concept. For example, the first elevated source/drain 161 may have at least one shape of a diamond, a circle and a rectangle. In embodiments illustrated in FIG. 4A, a diamond shaped (or pentagonal or hexagonal) first elevated source/drain 161 is exemplified.

For example, the first elevated source/drain 161 may have sidewalls 161a, a top surface 161b and a bottom surface 161c, as illustrated in FIG. 4A. The bottom surface 161c is a region contacting the fin F1 and the sidewalls 161a are connected to the bottom surface 161c. According to the shapes of the sidewalls 161a, the sidewalls 161a may not be seen from a top because they are inclined. As illustrated in FIG. 4A, the sidewall 161a may form an acute angle counterclockwise with respect to a surface of the fin F1.

In other words, the first elevated source/drain 161 includes a fifth part 161d and a sixth part 161e, the fifth part 161d is closer to the fin F1 than the sixth part 161e, and a width of the fifth part 161d is smaller than that of the sixth part 161e.

When the semiconductor device 1 according to some embodiments of the present inventive concept is a PMOS transistor, the first elevated source/drain 161 may include a compressive stress material. For example, the compressive stress material may be a material having a larger lattice constant than silicon (Si), for example, SiGe. The compressive stress material may improve the mobility of carriers of a channel region by applying compressive stress to the fin F1.

Alternatively, when the semiconductor device 1 according to some embodiments of the present inventive concept is an NMOS transistor, the first elevated source/drain 161 may include the same material as the substrate 100 or a tensile stress material. For example, when the substrate 100 includes Si, the first elevated source/drain 161 may include Si or a material having a smaller lattice constant than Si, for example, silicon carbide (SiC).

The interlayer dielectric film 171 may include, for example, a low k material having a lower dielectric constant than a silicon oxide film. For example, the interlayer dielectric film 171 may include fluorine doped silicon dioxide, carbon doped silicon dioxide, porous silicon dioxide, porous carbon doped silicon dioxide, spin on organic polymeric dielectrics (e.g., polyimide, polynobornene, bezocyclobutene, etc.), spin on silicon based polymeric dielectrics (e.g., hydrogen silsesquioxane (HSQ), methyl silsesquioxane (MSQ), etc.), and the like.

In the semiconductor device 1 according to the some embodiments of the present inventive concept, the first field dielectric films 110, 111_1 and 111_2 may be raised field dielectric films. As illustrated in FIG. 4A, the first field dielectric films 110, 111_1 and 111_2 may have a first part 110 positioned lower than a top surface of the fin F1 and second parts 111_1 and 111_2 positioned higher than the top surface of the fin F1. The second parts 111_1 and 111_2 are connected to the first part 110 and may protrude from the first part 110. The first part 110 and the second parts 111_1 and 111_2 may be made of the same material. The first field dielectric films 110, 111_1 and 111_2 may be formed of oxide films, for example, high density plasma (HDP) oxide films.

In addition, since the second parts 111_1 and 111_2 are formed to protrude from only a portion of the first part 110, widths W2 of the second parts 111_1 and 111_2 may be smaller than a width W1 of the first part 110.

In addition, the second parts 111_1 and 111_2 may make contact with the first elevated source/drain 161. Regions of the first elevated source/drain 161, where the sidewalls 161a and the top surface 161b meet, may protrude horizontally or laterally. Therefore, the second parts 111_1 and 111_2 may make contact with the horizontally protruding region of the first elevated source/drain 161. Furthermore, the second parts 111_1 and 111_2 may make contact with portions of sidewalls or a portion of the top surface of the first elevated source/drain 161.

The second parts 111_1 and 111_2 may make contact with the sixth part 161e of the first elevated source/drain 161 but may not make contact with the fifth part 161d of the first elevated source/drain 161. Therefore, a portion between the second parts 111_1 and 111_2 and the fifth part 161d may be filled with an airgap 184a. In other words, regions surrounded by the first part 110 and the second parts 111_1 and 111_2 of the first field dielectric films 110, 111_1 and 111_2 and the first elevated source/drain 161 may be filled with the airgap 184a.

When the first elevated source/drain 161 is formed by an epitaxial method, the second parts 111_1 and 111_2 serve to define a position where the first elevated source/drain 161 is to be formed. As will be discussed later, since the second parts 111_1 and 111_2 of the first field dielectric films 110, 111_1 and 111_2 are formed to protrude to a predetermined height, the first elevated source/drain 161 cannot spreads laterally. In other words, the first elevated source/drain 161 may grow up to points at which it meets the second parts 111_1 and 111_2.

As illustrated, the second parts 111_1 and 111_2 are disposed at opposite sides of the corresponding first elevated source/drain 161, but aspects of the present inventive concept are not limited thereto. When necessary, the second parts 111_1 and 111_2 may also be disposed only at one side of the corresponding first elevated source/drain 161. In addition, as illustrated in FIGS. 1 and 2, the second parts 111_1 and 111_2 may be formed to extend lengthwise in a second direction Y1 and to intersect the first gate electrode 147. In addition, the fin F1 also extends lengthwise in the second direction Y1 and to intersect the first gate electrode 147.

Therefore, as illustrated in FIG. 4B, the first gate electrode 147 may include a recess 1147 through which the fin F1 passes and recesses 1148 and 1149 through which the second parts 111_1 and 111_2 pass, respectively. In other words, the first gate electrode 147 is formed in a smaller area than an area of a gate electrode without the recesses 1148 and 1149 by areas of the recesses 1148 and 1149. As a result, parasitic gate capacitance, which may occur between gate electrodes adjacent to the first gate electrode 147, can be reduced.

Figure 5:
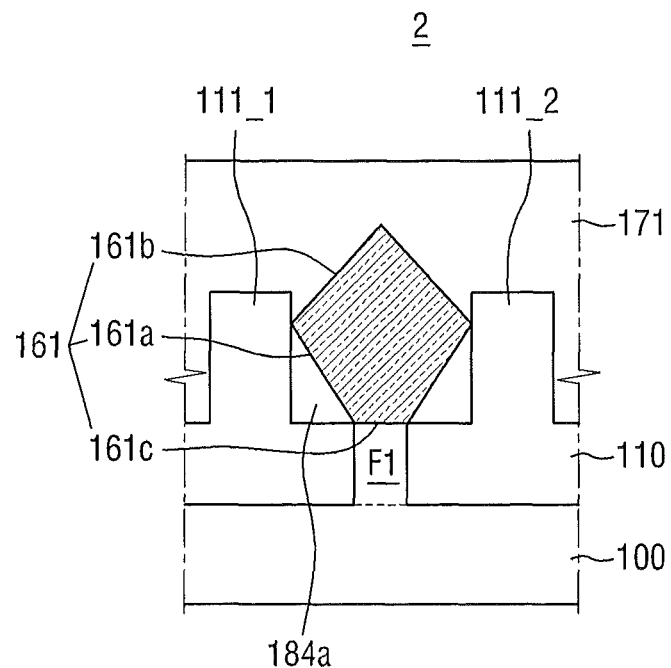
FIG. 5 is a perspective view of a semiconductor device according to some embodiments of the present inventive concept.

FIG. 5 is a perspective view of a semiconductor device according to some embodiments of the present inventive concept. Many of the details discussed above with respect to FIGS. 1 through 4B apply to embodiments illustrated in FIG. 5, thus, in the interest of brevity, the following description will focus on differences between the present embodiment and embodiments of the present inventive concept discussed above with respect to FIGS. 1 to 4B.

Referring now to FIG. 5, in the semiconductor device 2 according some embodiments of the present inventive concept, portions between the second parts 111_1 and 111_2 and the fifth part 161d may be filled with an insulating material 184a having a lower dielectric constant than the first field dielectric films 110, 111_1 and 111_2. In other words, regions surrounded by the first part 110 and second parts 111_1 and 111_2 of the first field dielectric films 110, 111_1 and 111_2 and the first elevated source/drain 161 may be filled with the insulating material 184a. In these embodiments, the insulating material 184a may include, for example, a low k material having a lower dielectric constant than a silicon oxide film. Examples of the insulating material 184a may include fluorine doped silicon dioxide, carbon doped silicon dioxide, porous silicon dioxide, porous carbon doped silicon dioxide, spin on organic polymeric dielectrics (e.g., polyimide, polynobornene, bezocyclobutene, etc.), spin on silicon based polymeric dielectrics (e.g., hydrogen silsesquioxane (HSQ), methyl silsesquioxane (MSQ), etc.), and the like.

When the interlayer dielectric film 171 is formed, the interlayer dielectric film 171 (made of a low k material) may fill the portions between the second parts 111_1 and 111_2 and the fifth part 161d. Therefore, the interlayer dielectric film 171 and the insulating material 184a may be made of the same material.

Figure 6:
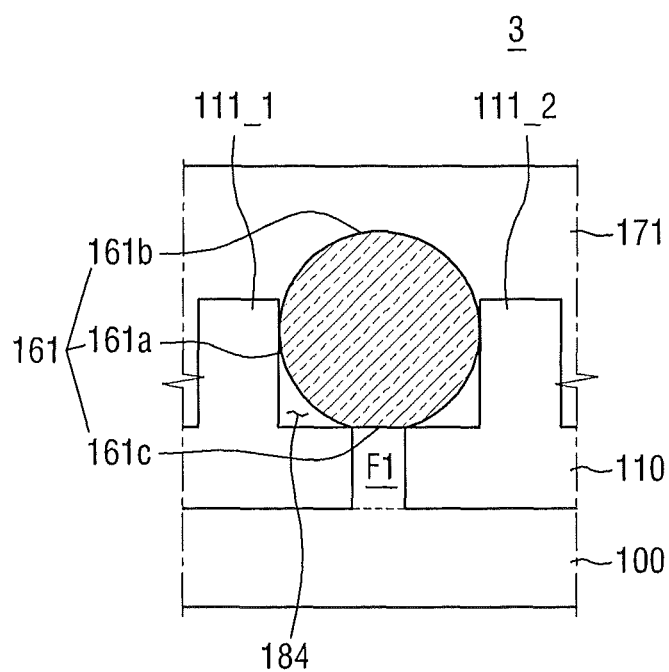
FIG. 6 is a perspective view of a semiconductor device according to some embodiments of the present inventive concept.

FIG. 6 a perspective view of a semiconductor device according to some embodiments of the present inventive concept. In the interest of brevity, the following description will focus on differences between the present embodiment and embodiments of the present inventive concept illustrated in FIGS. 1 to 4B.

Referring now to FIG. 6, in the semiconductor device 3 according to some embodiments of the present inventive concept, a first elevated source/drain 161 may have a circular cross section. Since the first elevated source/drain 161 has a circular cross section, a top surface 161b and sidewalls 161a may be connected to each other, like a smooth curve, and the sidewalls 161a and a bottom surface 161c may be connected to each other, like a smooth curve.

As illustrated in FIG. 6, second parts 111_1 and 111_2 of first field dielectric films 110, 111_1 and 111_2 may make contact with the smooth curve portion of the first elevated source/drain 161. An airgap 184 or a low k material may fill spaces between the second parts 111_1 and 111_2 and the first elevated source/drain 161.

Figure 7:
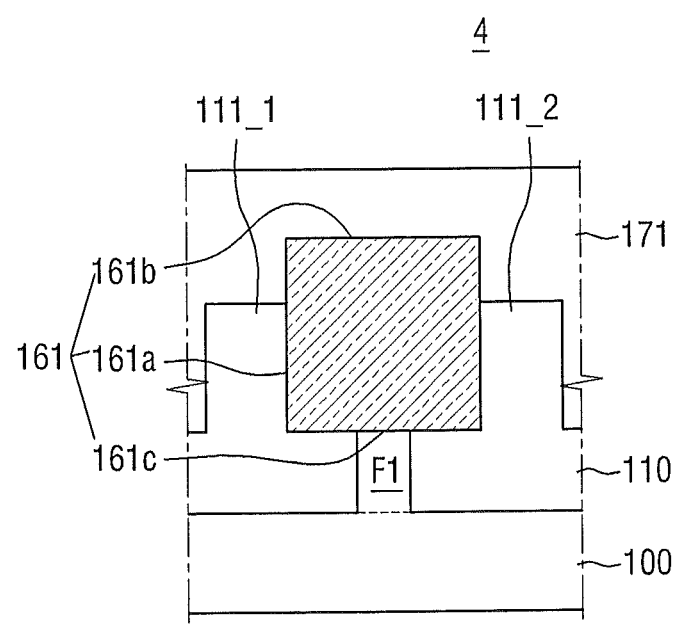
FIG. 7 is a perspective view of a semiconductor device according to some embodiments of the present inventive concept.

FIG. 7 is a perspective view of a semiconductor device according to some embodiments of the present inventive concept. In the interest of brevity, the following description will focus on differences between the present embodiment and embodiments of the present inventive concept discussed above with respect to FIGS. 1 to 4B.

Referring to FIG. 7, in the semiconductor device 4 according some embodiments of the present inventive concept, a first elevated source/drain 161 may have a rectangular shaped cross section. The first elevated source/drain 161 may have sidewalls 161a, a top surface 161b and a bottom surface 161c. The sidewalls 161a may be formed in a direction perpendicular to a top surface of a substrate 100 (or a top surface of the fin F1). A contact 181 may be in contact with a portion of the top surface 161b, and the fin F1 may be in contact with a portion of the bottom surface 161c.

As illustrated in FIG. 7, second parts 111_1 and 111_2 of first field dielectric films 110, 111_1 and 111_2 may make contact with the sidewalls 161a of the first elevated source/drain 161. However, since the first elevated source/drain 161 has a rectangular cross section, there may be no space between the second parts 111_1 and 111_2 and the first elevated source/drain 161, however, it will be understood that embodiments of the present inventive concept are not limited thereto.

Figure 8:
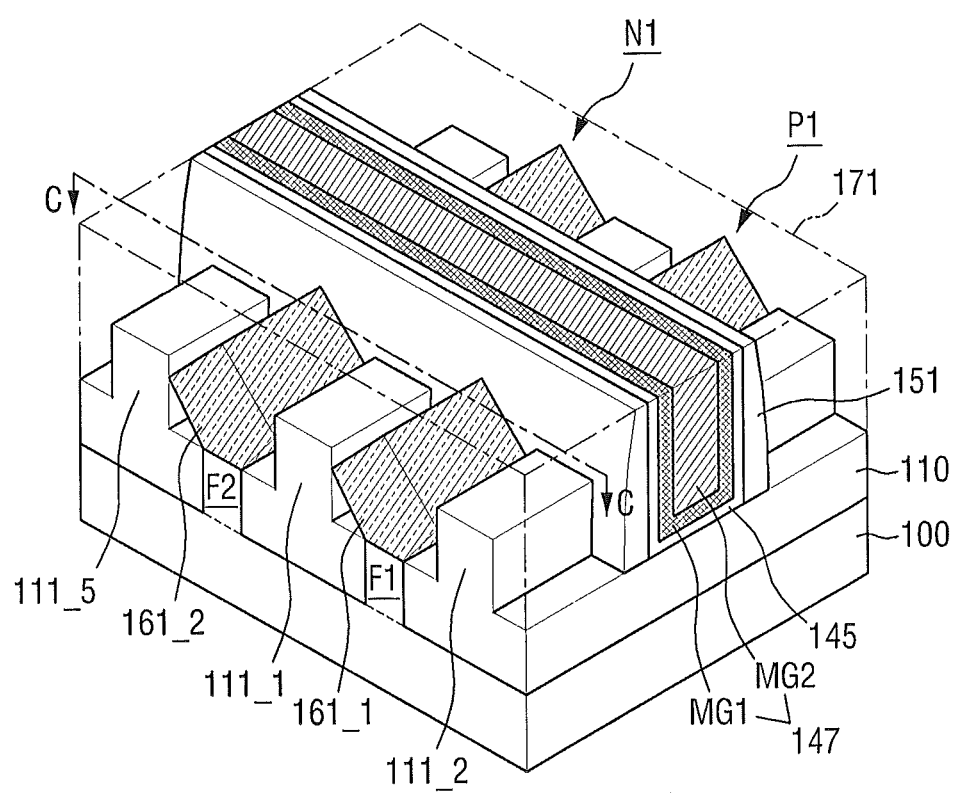
FIG. 8 is a perspective view of a semiconductor device according to some embodiments of the present inventive concept.
Figure 9:
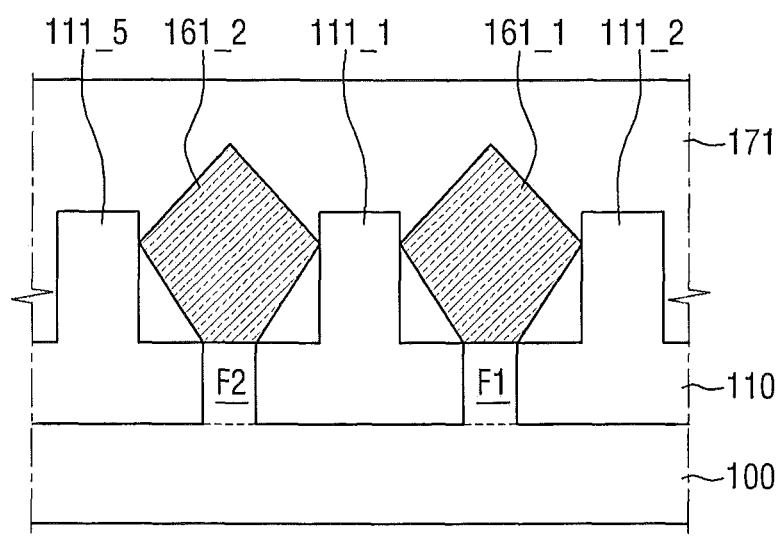
FIG. 9 is a cross section taken along the line C-C' of FIG. 8.

FIG. 8 is a perspective view of a semiconductor device according to some embodiments of the present inventive concept and FIG. 9 is a cross-sectional view taken along the line C-C' of FIG. 8. In the interest of brevity, the following description will focus on differences between the present embodiment and embodiments of the present inventive concept discussed above with respect to FIGS. 1 to 4B.

Referring to FIGS. 8 and 9, the semiconductor device 5 according to some embodiments of the present inventive concept may include a first fin type transistor P1 and a second fin type transistor N1. The first fin type transistor P1 may include a fin F1, a first gate electrode 147 and a first elevated source/drain 161_1. The second fin type transistor N1 may include a second fin F2, a first gate electrode 14, and a second elevated source/drain 161_2. In other words, the first fin type transistor P1 and the second fin type transistor N1 may share the first gate electrode 147.

In particular, the fin F1 and the second fin F2 may be formed on a substrate 100 to extend lengthwise in a second direction Y1. The first gate electrode 147 may be formed to intersect the fin F1 and the second fin F2. In addition, the first elevated source/drain 161_1 may be formed at opposite sides of the first gate electrode 147 on the fin F1. The second elevated source/drain 161_2 may be formed at opposite sides of the first gate electrode 147 on the second fin F2. As discussed above, the first elevated source/drain 161_1 and the second elevated source/drain 161_2 may be diamond shaped, circular or rectangular.

The first fin type transistor P1 may be a first conductivity type (e.g., P type) and the second fin type transistor N1 is a second conductivity type (e.g., N type). Therefore, the first elevated source/drain 161_1 may be doped with a first conductivity type dopant and the second elevated source/drain 161_2 may be doped with a second conductivity type dopant.

Embodiments of the present invention are described with reference to a particular polarity conductivity type for various layers/regions. However, as will be appreciated by those of skill in the art, the polarity of the regions/layers may be inverted to provide an opposite polarity device.

First field dielectric films 110, 111_1 and 111_2 may have a first part 110 positioned lower than top surfaces of the fin F1 and the second fin F2, and a plurality of second parts 111_1 and 111_2 positioned higher than the top surfaces of the fin F1 and the second fin F2.

In particular, the second parts 111_1 and 111_2 are between the first elevated source/drain 161_1 and the second elevated source/drain 161_2. Therefore, the first elevated source/drain 161_1 and the second elevated source/drain 161_2 do not make contact with each other. If the first elevated source/drain 161_1 and the second elevated source/drain 161_2 make contact with each other, a short circuit is generated, thereby possibly preventing the first fin type transistor P1 and the second fin type transistor N1 from operating properly.

In other words, when the first elevated source/drain 161_1 and the second elevated source/drain 161_2 are grown in a narrow region, the second parts 111_1 and 111_3 may prevent the first elevated source/drain 161_1 and the second elevated source/drain 161_2 from making contact with each other.

Figure 10:
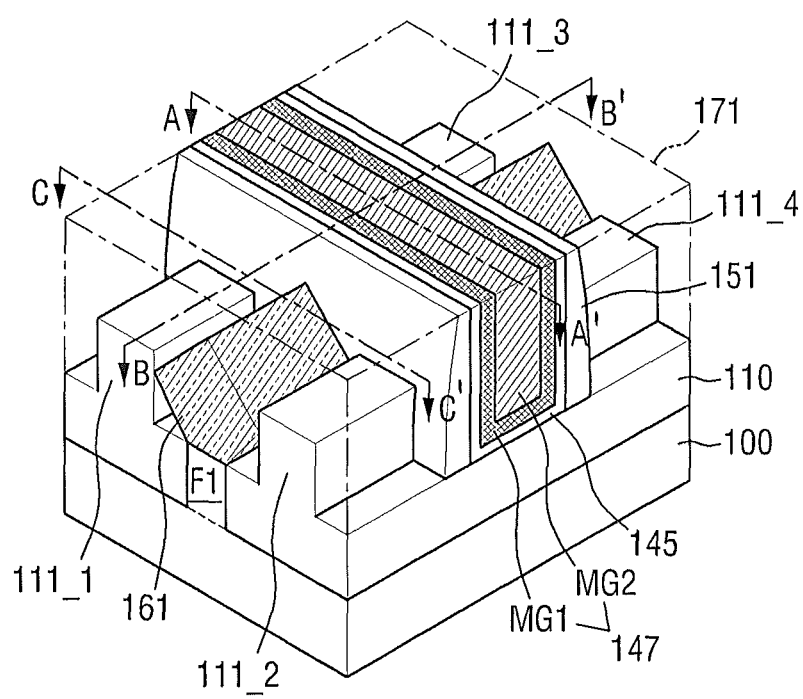
FIG. 10 is a perspective view of a semiconductor device according to some embodiments of the present inventive concept.
Figure 10:
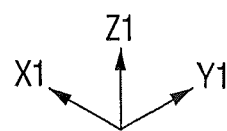

FIG. 10 is a perspective view of a semiconductor device according to some embodiments of the present inventive concept. As illustrated in FIG. 10, first field dielectric films 110 and 111_1 to 111_4 may have a first part 110 positioned lower than a top surface of a fin F1 and second parts 111_1 to 111_4 positioned higher than the top surface of the fin F1. The second parts 111_1 to 111_4 are connected to the first part 110 and may protrude from the first part 110. The first part 110 and the second parts 111_1 to 111_4 may be made of the same material. The first field dielectric films 110 and 111_1 to 111_4 may be formed of oxide films, for example, high density plasma (HDP) oxide films.

The second parts 111_1 to 111_4 are disconnected from one another. In other words, in view of a first gate electrode 147, the second parts 111_1 and 111_2 may be disposed at one side (e.g., a front side in FIG. 10) and the second parts 111_3 and 111_4 may be disposed at the other side (e.g., a rear side in FIG. 10). As a result, the second parts 111_1 to 111_4 may not intersect the first gate electrode 147. Therefore, the first gate electrode 147 may not include recesses allowing the second parts 111_1 to 111_4 to pass therethrough.

Furthermore, the second parts 111_1 to 111_4 may make contact with a first elevated source/drain 161. The first elevated source/drain 161 may grow up to points at which it meets the second parts 111_1 to 111_4. Therefore, the second parts 111_1 to 111_4 may define a region where the first elevated source/drain 161 can grow.

Figure 11:
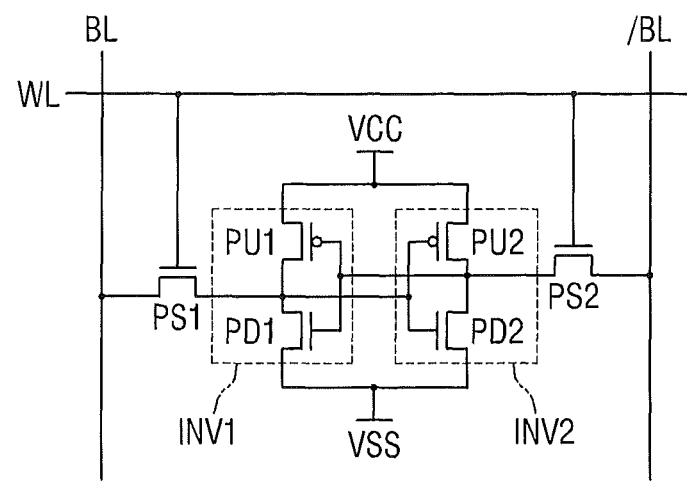
FIGS. 11 and 12A-12B are a circuit view and a layout view, respectively, of a semiconductor device according to some embodiments of the present inventive concept.
Figure 12A:
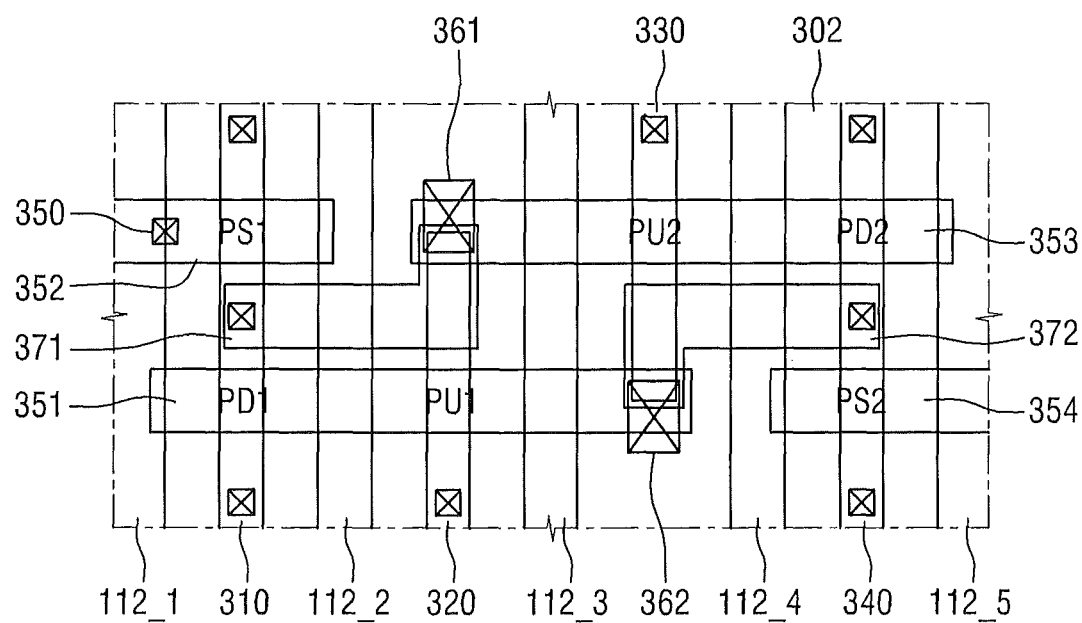
Figure 12B:
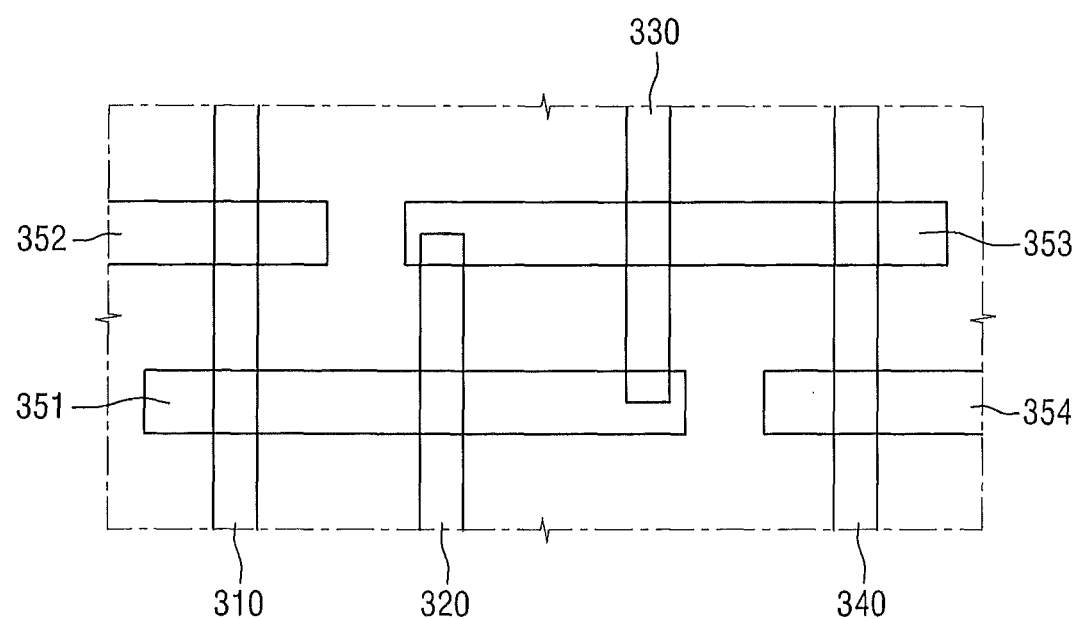
Figure 13:
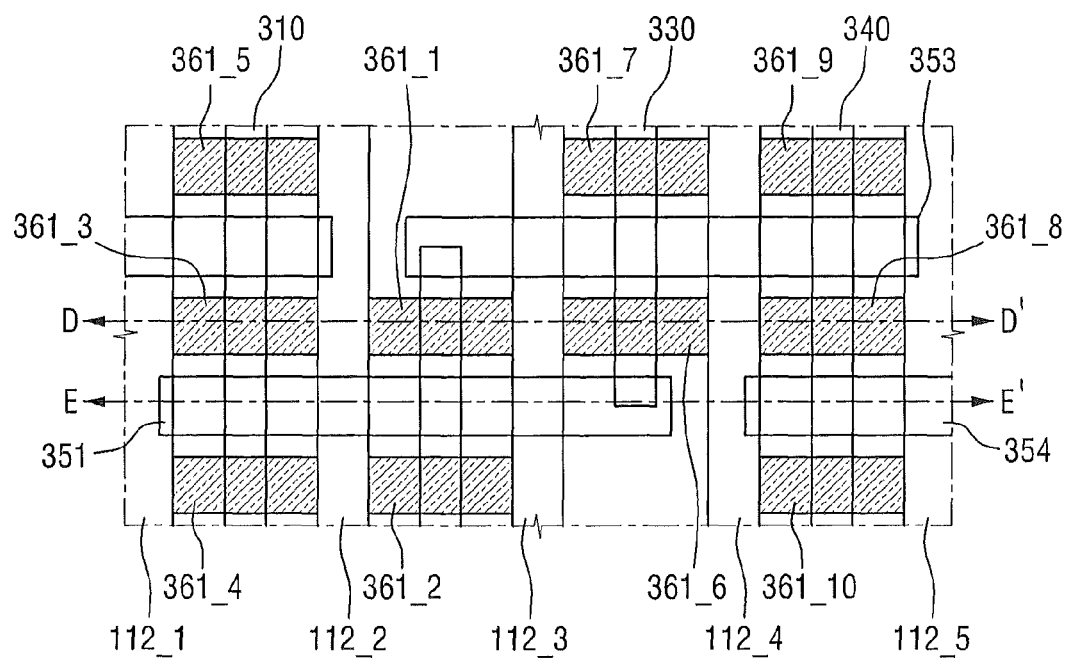
FIG. 13 illustrates only a plurality of fins, a plurality of gate electrodes and a second part of a first field dielectric film in the layout view of FIG. 12A.
Figure 14:
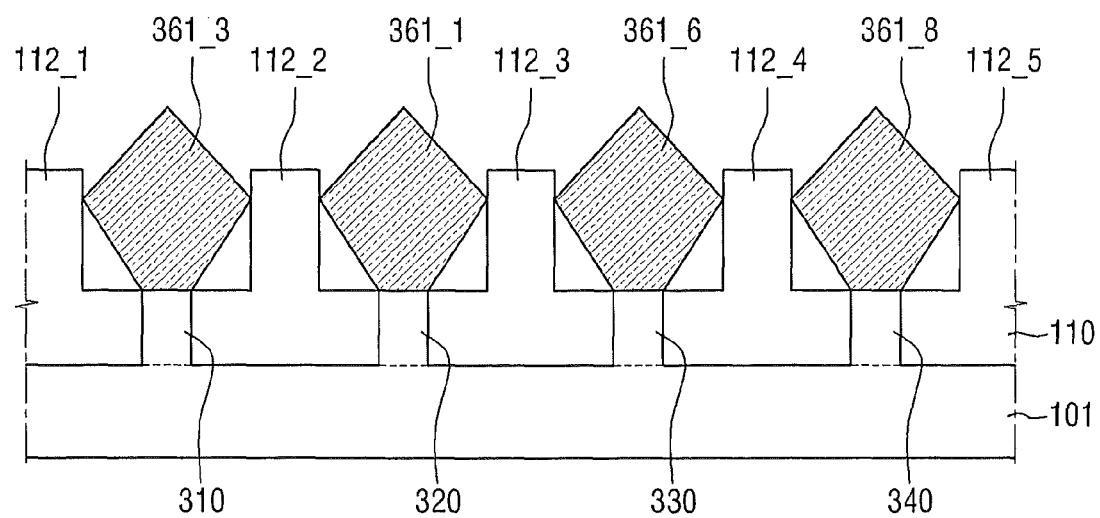
FIG. 14 is a cross-sectional view taken along the line D-D' of FIG. 13.
Figure 15:
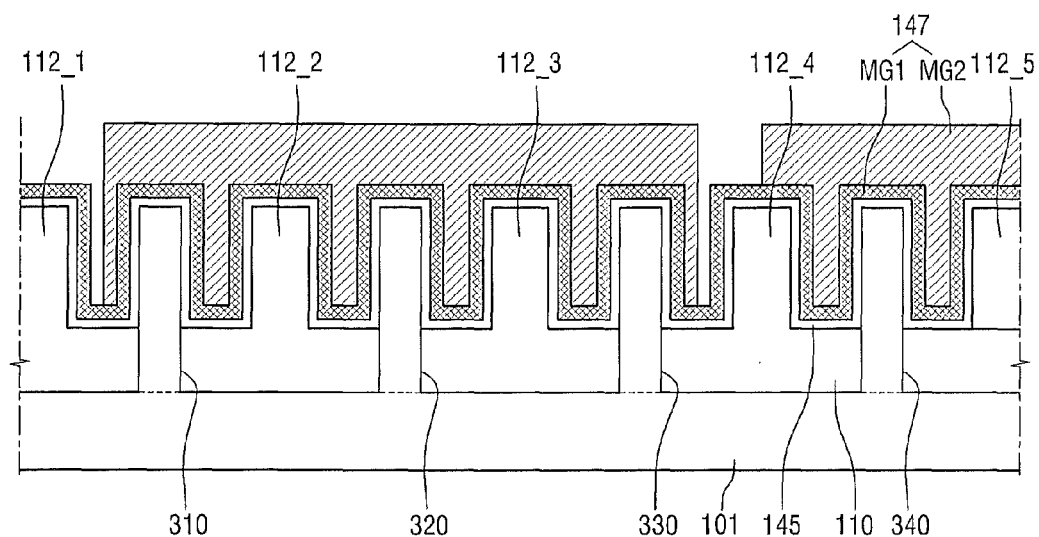
FIG. 15 is a cross-sectional view taken along the line E-E' of FIG. 13.
Figure 16:
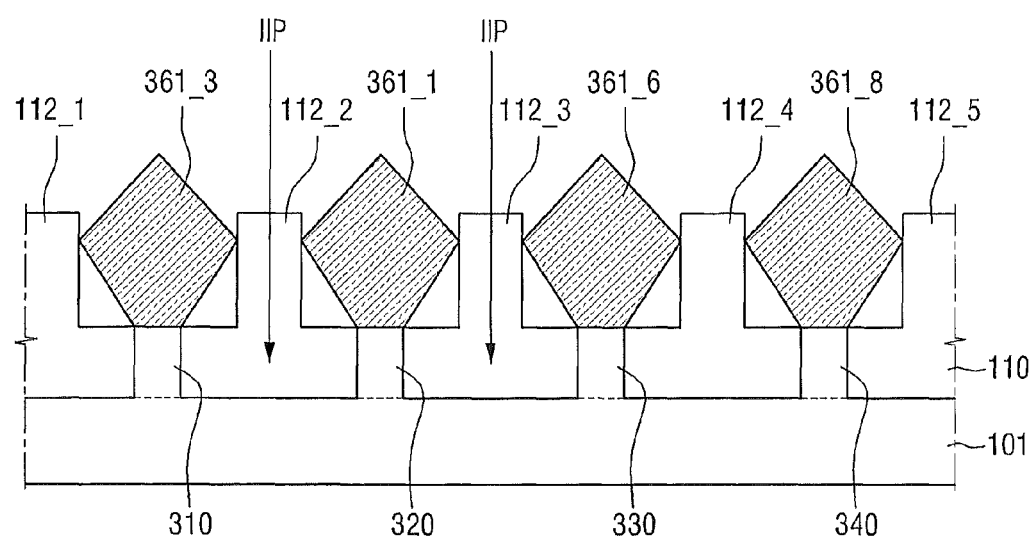
FIG. 16 illustrates effects of the semiconductor device according to some embodiments of the present inventive concept.

FIGS. 11 and 12A-12B are a circuit view and a layout view of a semiconductor device, respectively, according to some embodiments of the present inventive concept, FIG. 12B illustrates a plurality of fins and a plurality of gate electrodes in the layout view of FIG. 12A, FIG. 13 illustrates a plurality of fins, a plurality of gate electrodes and a second part of a first field dielectric film in the layout view of FIG. 12A, FIG. 14 is a cross-sectional view taken along the line D-D' of FIG. 13, FIG. 15 is a cross-sectional view taken along the line E-E' of FIG. 13, and FIG. 16 illustrates effects of the semiconductor device according to some embodiments of the present inventive concept.

First, referring to FIG. 11, the semiconductor device 7 according some embodiments of the present inventive concept may include a pair of inverters INV1 and INV2 connected in parallel between a power supply node Vcc and a ground node Vss, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors.

In order to constitute a latch circuit, an input node of the first inverter INV1 is connected to an output node of the second inverter INV2 and an input node of the second inverter INV2 is connected to an output node of the first inverter INV1.

Referring to FIGS. 12A to 15, a first fin 310, a second fin 320, a third fin 330 and a fourth fin 340, which are spaced apart from one another, may extend lengthwise in a direction (e.g., in an up-and-down direction of FIG. 12B). The second fin 320 and the third fin 330 may extend in smaller lengths than the first fin 310 and the fourth fin 340.

In addition, a first gate electrode 351, a second gate electrode 352, a third gate electrode 353, and a fourth gate electrode 354 are formed to extend in the other direction (for example, in a left-and-right direction of FIG. 12B) to intersect the first fin 310 to the fourth fin 340. In particular, the first gate electrode 351 completely intersects the first fin 310 and the second fin 320 while partially overlapping a terminal of the third fin 330. The third gate electrode 353 completely intersects the fourth fin 340 and the third fin 330 while partially overlapping a terminal of the second fin 320.

The second gate electrode 352 and the fourth gate electrode 354 are formed to intersect the first fin 310 and the fourth fin 340, respectively.

As illustrated, the first pull-up transistor PU1 is defined in vicinity of an intersection of the first gate electrode 351 and the second fin 320, the first pull-down transistor PD1 is defined in vicinity of an intersection of the first gate electrode 351 and the first fin 310, and the first pass transistor PS1 is defined in vicinity of an intersection of the second gate electrode 352 and the first fin 310. The second pull-up transistor PU2 is defined in vicinity of an intersection of the third gate electrode 353 and the third fin 330, the second pull-down transistor PD2 is defined in vicinity of an intersection of the third gate electrode 353 and the fourth fin 340, and the second pass transistor PS2 is defined in vicinity of an intersection of the fourth gate electrode 354 and the fourth fin 340.

First to tenth elevated sources/drains 361_1 to 361_10 may be formed at opposite sides of the respective intersections of the first to fourth gate electrodes 351-354 and the first to fourth fins 310, 320, 330 and 340. As discussed above, the first to tenth elevated sources/drains 361_1 to 361_10 may be formed by an epitaxial method. The first to tenth elevated sources/drains 361_1 to 361_10 may have at least one shape of a diamond, a circle and a rectangle. FIG. 13 illustrates the first to tenth elevated sources/drains 361_1 to 361_10, which are viewed from a top.

In particular, the first and second elevated sources/drains 361_1 and 361_2 may be disposed at opposite sides of the first gate electrode 351, on the second fin 320.

The third to fifth elevated sources/drains 361_3 to 361_5 may be disposed at one side of the first gate electrode 351, between the first gate electrode 351 and the second gate electrode 352 and at the other side of the second gate electrode 352, on the first fin 310.

The sixth and seventh elevated sources/drains 361_6 and 361_7 may be disposed at opposite sides of the third gate electrode 353, on the third fin 330.

The eighth to tenth elevated sources/drains 361_8 to 361_10 may be disposed at one side of the third gate electrode 353, between the third gate electrode 353 and the fourth gate electrode 354 and at the other side of the fourth gate electrode 354, on the fourth fin 340.

Since the first pull-up transistor PU1 and the second pull-up transistor PU2 are of a first conductivity type (e.g., P type), the first, second, sixth and seventh elevated sources/drains 361_1, 361_2, 361_6 and 361_7 are doped with first conductivity type (e.g., P type) dopant.

Since the first pull-down transistor PD1, the second pull-down transistor PD2, the first pass transistor PS1 and the second pass transistor PS2 are of a second conductivity type (e.g., N type), the third to fifth and the eighth to tenth elevated sources/drains 361_3 to 361_5 and 361_8 to 361_10 are doped with a dopant of a second conductivity type (e.g., N type) different from the first conductivity type.

In addition, a plurality of contacts 350 may be formed. A shared contact 361 concurrently connects the second fin 320, a third gate line 353 and an interconnection 371. The shared contact 361 may also concurrently connect the third fin 330, a first gate line 351 and an interconnection 372.

As discussed above, the first field dielectric films 110 and 112_1 to 112_5 may have a first part 110 and a plurality of second parts 112_1 to 112_5. The plurality of second parts 112_1 to 112_5 may be positioned higher than top surfaces of the first fin 310 to the fourth fin 340.

In particular, the second parts 112_1 to 112_5 may be disposed between one and another among the first to tenth elevated sources/drains 361_1 to 361_10. In particular, for example, the second part 112_2 may be formed to extend lengthwise between the first fin 310 and the second fin 320. In other words, the second part 112_2 is disposed between the first elevated source/drain 361_1 and a third elevated source/drain 361_3 and between the second elevated source/drain 361_2 and the fourth elevated source/drain 3614. Therefore, the second part 112_2 may prevent the first elevated source/drain 361_1 and the third elevated source/drain 361_3 from making contact with each other and being shorted from each other. Likewise, the second elevated source/drain 361_2 and the fourth elevated source/drain 361_4 do not make contact with each other and are not shorted.

The second part 112_3 may be formed to extend lengthwise between the second fin F2 and the third fin 330. In other words, the second part 112_3 is between the first elevated source/drain 361_1 and the sixth elevated source/drain 361_6.

The second part 112_4 may be formed to extend lengthwise between the third fin 330 and the fourth fin 340. In other words, the second part 112_4 is disposed between the seventh elevated source/drain 361_7 and the ninth elevated source/drain 361_9 and between the sixth elevated source/drain 361_6 and the eighth elevated source/drain 361_8.

In addition, the second part 112_1 may be formed to extend lengthwise at the other side of the first fin 310. The second part 112_1 may prevent the third to fifth elevated sources/drains 361_3 to 361_5 from making contact with an adjacent device (e.g., an adjacent SRAM cell).

The second part 112_5 may be formed to extend lengthwise at one side of the fourth fin 340. The second part 112_5 may prevent the eighth to tenth elevated sources/drains 361_8 to 361_10 from making contact with an adjacent device (e.g., an adjacent SRAM cell).

Referring to FIG. 16, the second parts 112_1 to 112_5 may prevent the dopant from penetrating into a substrate 101 during implantation (IIP). In other words, in order to form N type transistors (i.e., PS1, PD1, PS2 and PD2), an N type dopant may be implanted, and in order to form P type transistors (i.e., PU1 and PU2), a P type dopant may be implanted. When the N type dopant or the P type dopant is implanted (IIP), the first field dielectric films 110, 111_1 and 111_2 may prevent the dopant from penetrating into the substrate 101. If the dopant penetrates into the substrate 101, adjacent fins may be electrically connected to each other, possibly resulting in a malfunction.

Figure 17:
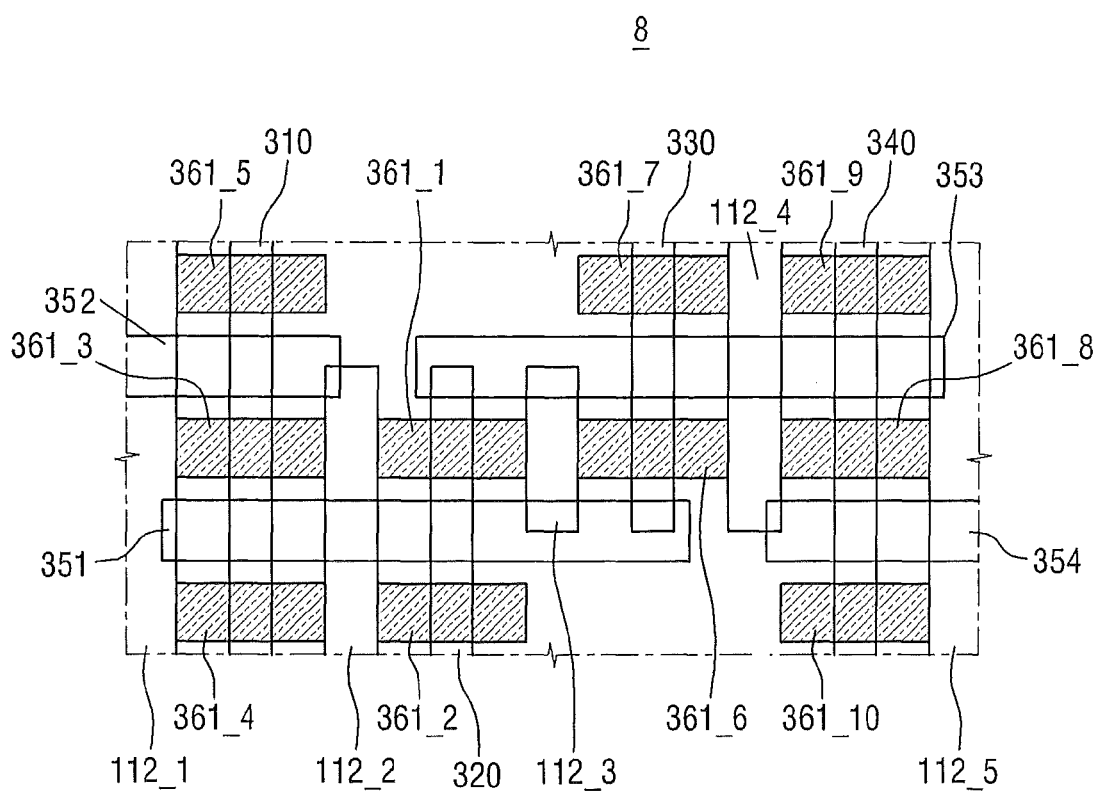
FIG. 17 is a perspective view of a semiconductor device according to some embodiments of the present inventive concept.

FIG. 17 is a perspective view of a semiconductor device according to some embodiments of the present inventive concept. In the interest of brevity, the following description will focus on differences between the present embodiment and embodiments of the present inventive concept discussed above with respect to FIGS. 11 to 16.

Referring to FIG. 17, in the semiconductor device 8 according to some embodiments the present inventive concept, second parts 112_2, 112_3 and 112_4 are shorter than the second parts 112_2, 112_3 and 112_4 shown in FIG. 13. In detail, the second part 112_2 does not make contact with a fifth elevated source/drain 361_5 but makes contact with first to fourth elevated sources/drains 361_1 to 361_4. In addition, the second part 112_3 makes contact with the first source/drain 361_1 and a sixth elevated source/drain 361_6. In addition, the second part 112_4 does not make contact with a tenth elevated source/drain 361_10 but makes contact with the sixth elevated source/drain 361_6 to a ninth elevated source/drain 361_9.

Figure 18:
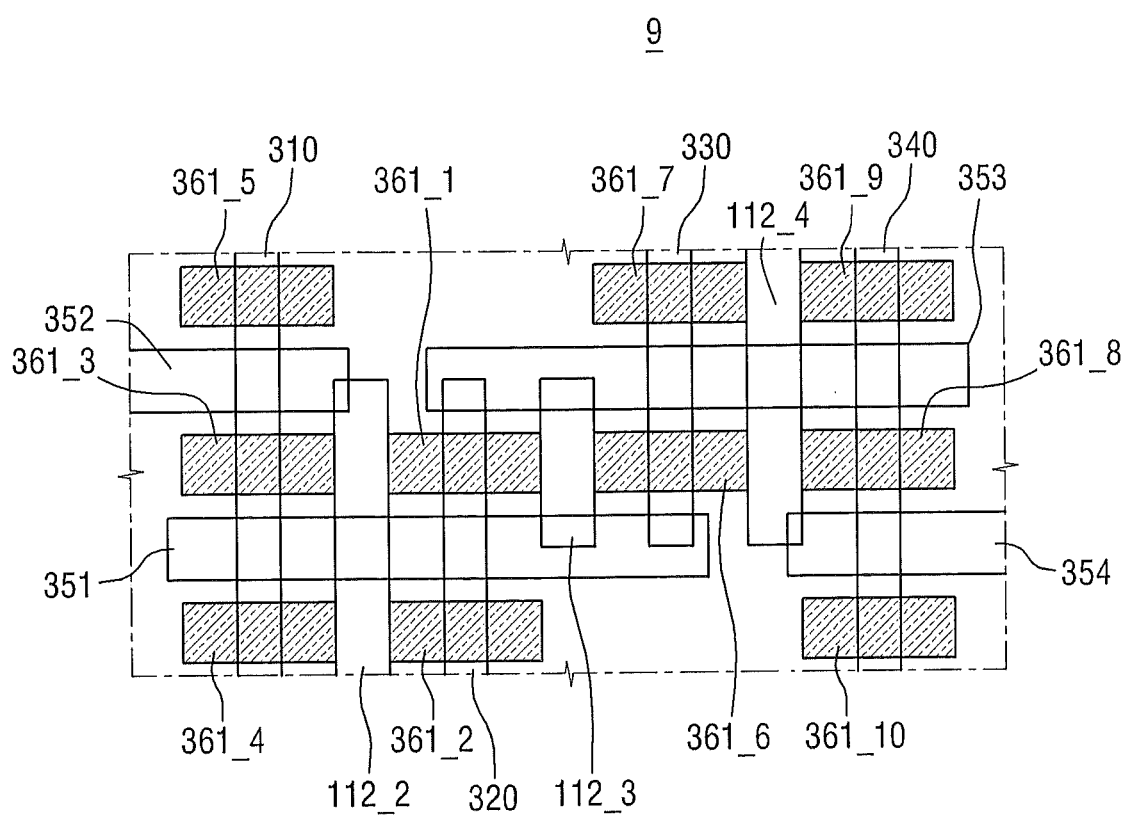
FIG. 18 is a perspective view of a semiconductor device according to a ninth embodiment of the present inventive concept.

FIG. 18 is a perspective view of a semiconductor device according to some embodiments of the present inventive concept. In the interest of brevity, the following description will focus on differences between the present embodiment and embodiments of the present inventive concept discussed above with respect to FIG. 17.

Referring to FIG. 18, in the semiconductor device 9 according to some embodiments of the present inventive concept, a second part 112_1 extending lengthwise at the other side of a fin 310 and a second part 112_5 extending lengthwise at one side of a fourth fin 40 are not provided. In other words, if an adjacent device (e.g., an adjacent SRAM cell) is not provided, the second parts 112_1 and 112_5 may not be formed.

Figure 19A:
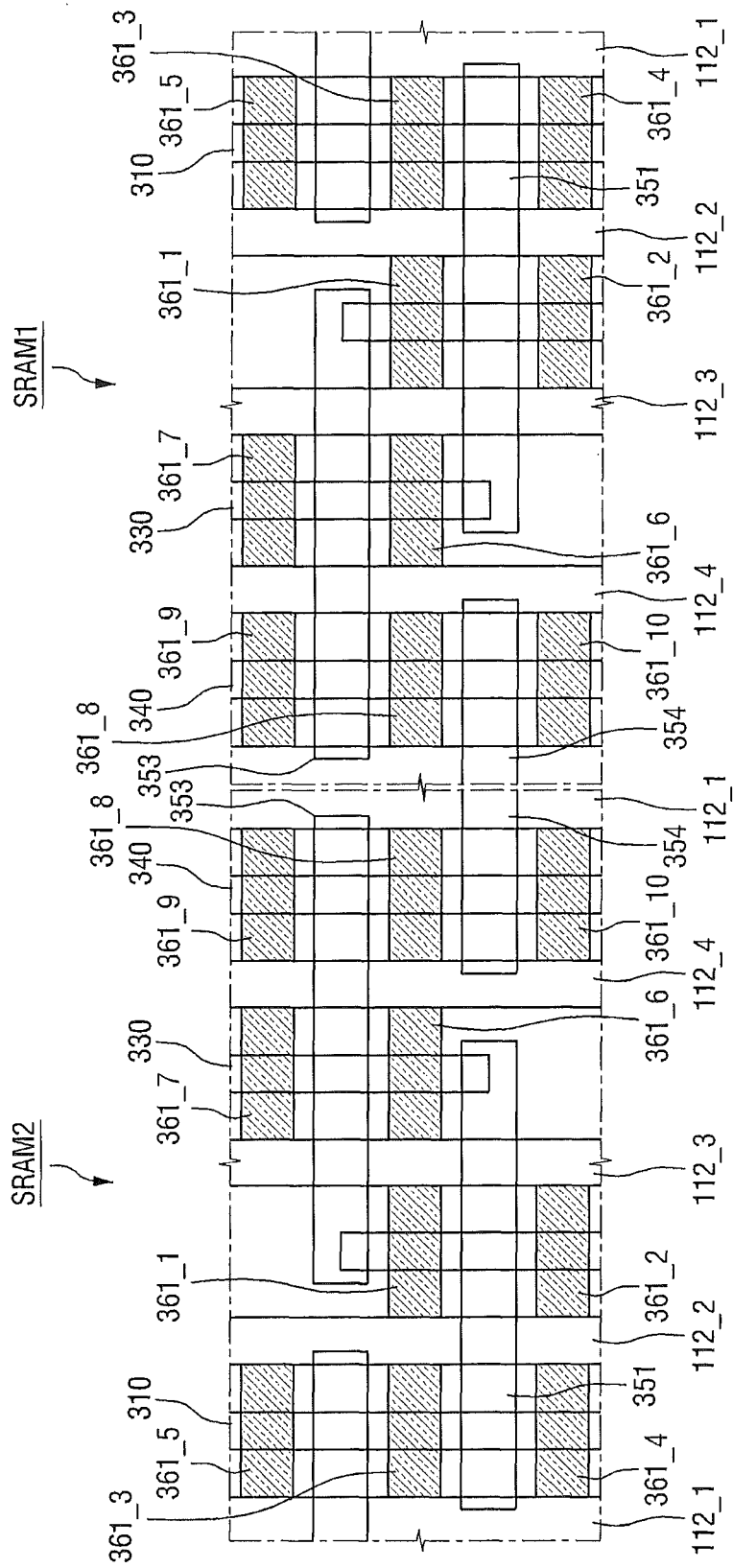
FIG. 19A is a perspective view of a semiconductor device according to some embodiments of the present inventive concept.

FIG. 19A is a perspective view of a semiconductor device according to some embodiments of the present inventive concept. In the interest of brevity, the following description will focus on differences between the present embodiment and embodiments of the present inventive concept discussed above with respect to FIG. 13.

Referring to FIG. 19A, the semiconductor device 10 according to some embodiments of the present inventive concept may include a first SRAM cell SRAM1 and a second SRAM cell SRAM2. In these embodiments, the first SRAM cell SRAM1 and the second SRAM cell SRAM2 may be disposed to be mirrored with respect to each other. In FIG. 19A, the semiconductor device 7 shown in FIG. 13 is exemplified as the first SRAM cell SRAM1, but aspects of the present inventive concept are not limited thereto. In other words, the first SRAM cell SRAM1 may also be the semiconductor device 8 shown in FIG. 17.

In these embodiments, the first SRAM cell SRAM1 and the second SRAM cell SRAM2 may share a second part 112_1. In other words, since second part 112_1 is disposed between the first SRAM cell SRAM1 and the second SRAM cell SRAM2, third to fifth elevated sources/drains 361_3 to 361_5 of the first SRAM cell SRAM1 and elevated sources/drains 361_3 to 361_5 of the second SRAM cell SRAM2 are made not to contact each other.

Figure 19B:
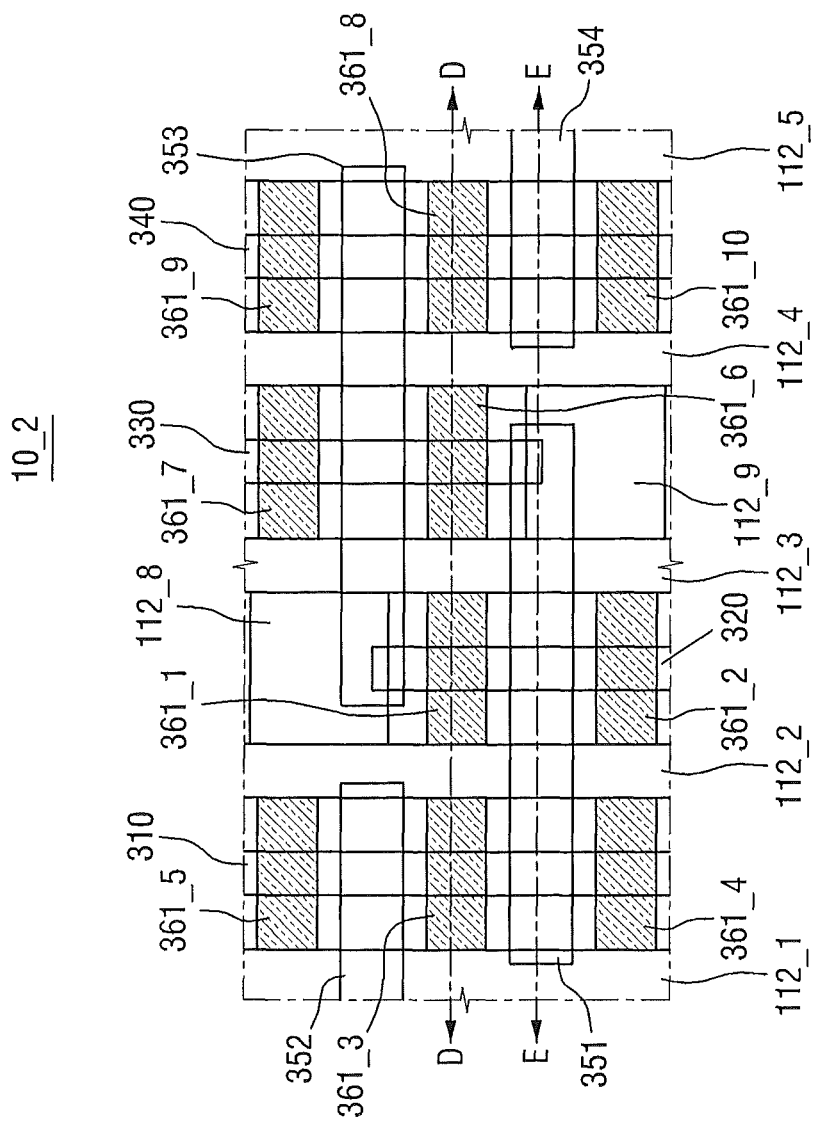
FIG. 19B is a perspective view of a semiconductor device according to some embodiments of the present inventive concept.

FIG. 19B is a perspective view of a semiconductor device according to some embodiments of the present inventive concept. In the interest of brevity, the following description will focus on differences between the present embodiment and embodiments of the present inventive concept discussed above with respect to FIG. 13.

Referring to FIG. 19B, the semiconductor device 10_2 according to some embodiments of the present inventive concept may further include second parts 112_8 and 112_9. The second part 112_8 may be formed between a second part 112_2 and a second part 112_3 to connect the second part 112_2 and the second part 112_3 to each other. The second part 112_8 may partially overlap with a third gate electrode 353 and a second fin 320, but aspects of the present inventive concept are not limited thereto. For example, the second part 112_8 may partially overlap with the third gate electrode 353.

In addition, the second part 112_9 may be formed between the second part 112_3 and a second part 112_4 to connect the second part 112_3 and the second part 112_4 to each other. The second part 112_9 may partially overlap with a first gate electrode 351 and a third fin 330, but aspects of the present inventive concept are not limited thereto. For example, the second part 112_9 may partially overlap with the first gate electrode 351. As discussed above, the second parts 112_8 and 112_9 may reduce parasitic gate capacitance.

Figure 19C:
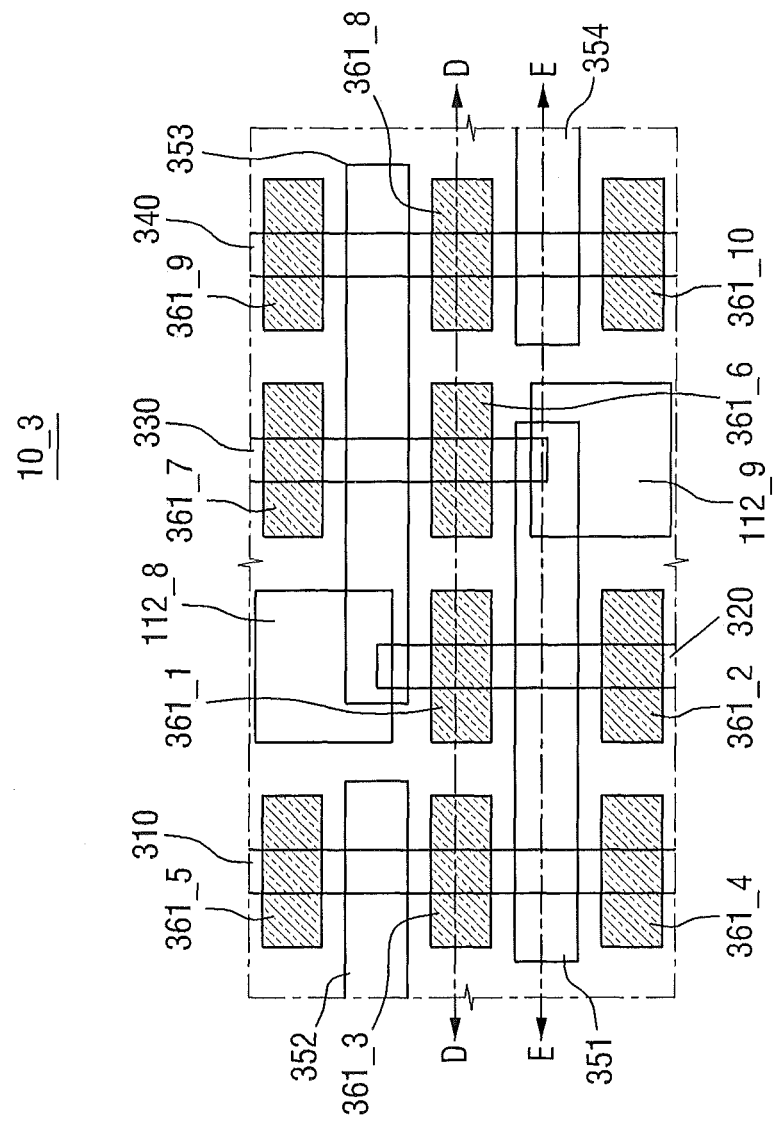
FIG. 19C is a perspective view of a semiconductor device according to some embodiments of the present inventive concept.

FIG. 19C is a perspective view of a semiconductor device according to some embodiments of the present inventive concept. In the interest of brevity, the following description will focus on differences between the present embodiment and embodiments of the present inventive concept discussed above with respect to FIG. 19B.

Referring to FIG. 19C, the semiconductor device according some embodiments of the present inventive concept may not include second parts 112_1 to 112_5 but may include only second parts 112_8 and 112_9. The second part 112_8 may partially overlap with a third gate electrode 353 and a second fin 320. The second part 112_9 may partially overlap with a first gate electrode 351 and a third fin 330.

Figure 19D:
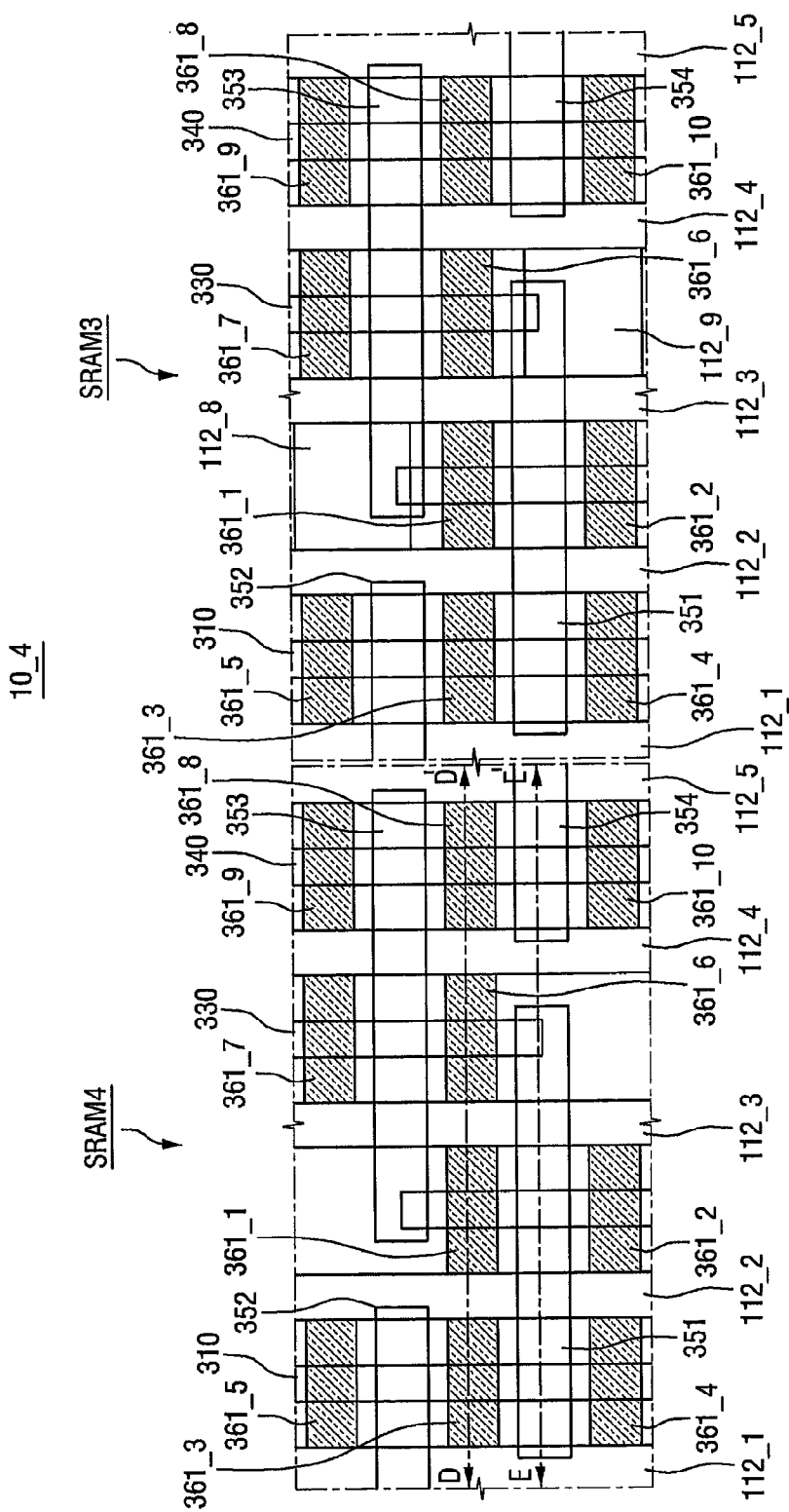
FIG. 19D is a perspective view of a semiconductor device according to some embodiments of the present inventive concept.

FIG. 19D is a perspective view of a semiconductor device according to a tenth fourth ((10_4)th) embodiment of the present inventive concept. In the interest of brevity, the following description will focus on differences between the present embodiment and embodiments of the present inventive concept discussed above with respect to FIGS. 13 and 19B.

Referring to FIG. 19D, the semiconductor device 104 according to some embodiments of the present inventive concept may include different types of SRAM cells SRAM3 and SRAM4. In other words, the SRAM cells SRAM3 and SRAM4 different from each other may be provided on a single wafer (chip).

For example, the semiconductor device 10_2 shown in FIG. 19B is exemplified as the third SRAM cell SRAM3, but aspects of the present inventive concept are not limited thereto. In other words, the semiconductor device 103 shown in FIG. 19C may also be used as the third SRAM cell SRAM3.

In addition, the semiconductor device 7 shown in FIG. 13 is exemplified as the fourth SRAM cell SRAM4, but aspects of the present inventive concept are not limited thereto. In other words, the semiconductor device 8 shown in FIG. 17 or the semiconductor device 9 shown in FIG. 18 may also be used as the fourth SRAM cell SRAM4.

Figure 20:
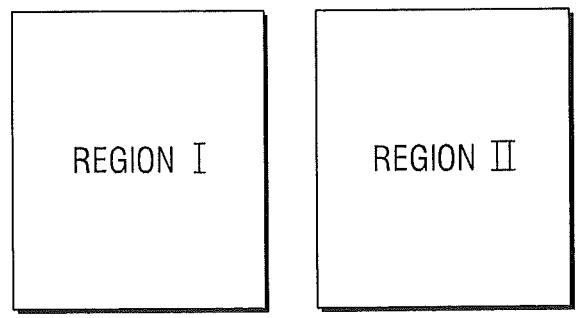
FIG. 20 is a block diagram of a semiconductor device according to some embodiments of the present inventive concept.
Figure 21A:
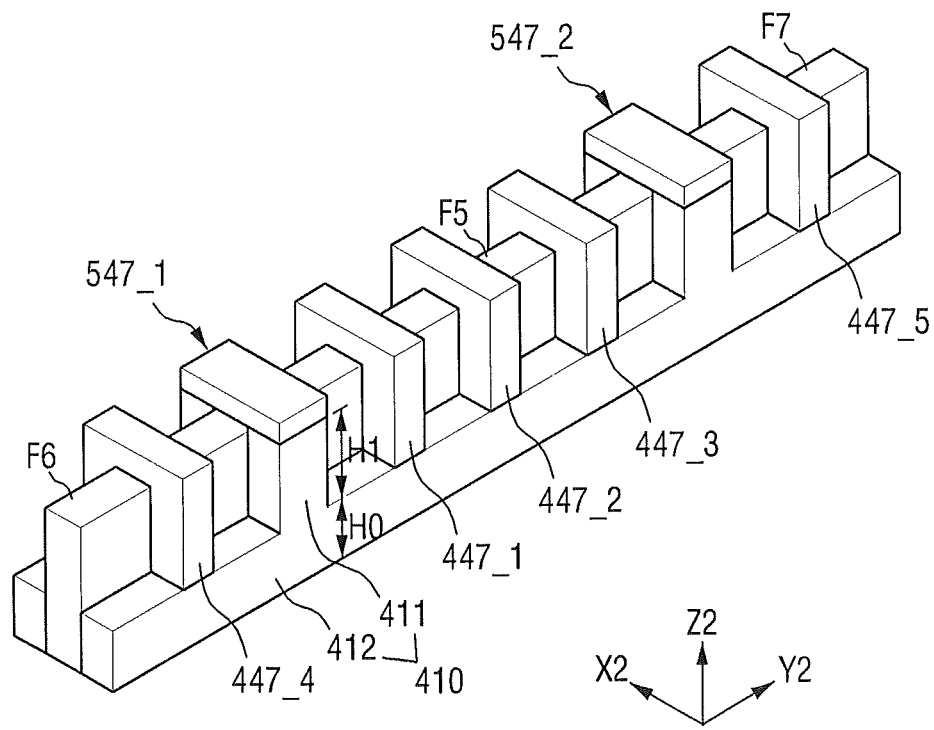
FIG. 21A is a perspective view illustrating a second raised field dielectric film formed in a first part shown in FIG. 20.
Figure 21B:
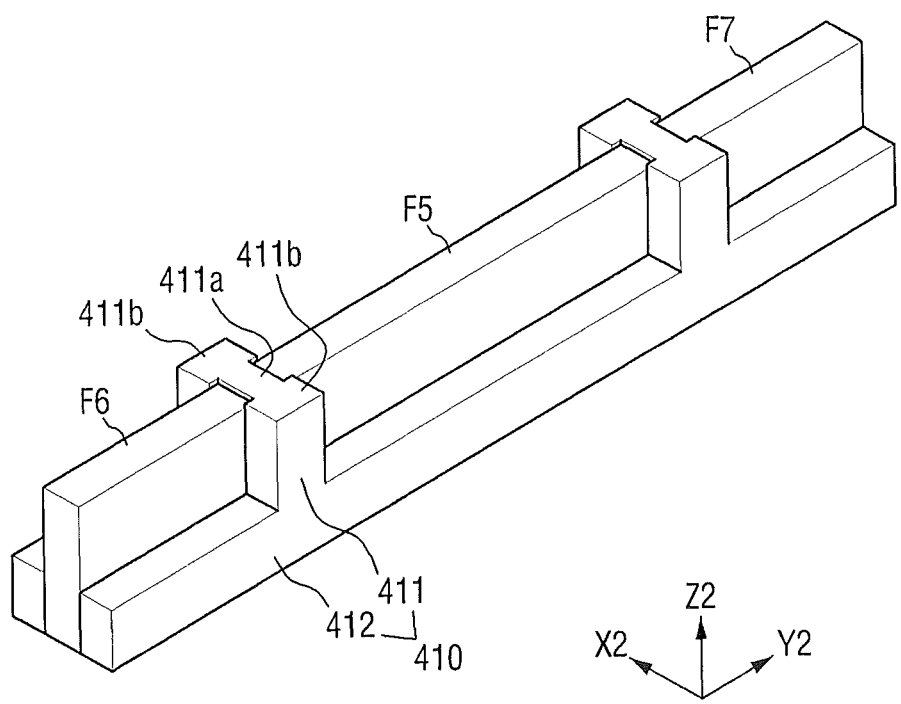
FIG. 21B is a partially perspective view illustrating a plurality of fins and the second raised field dielectric film shown in FIG. 21A.
Figure 22:
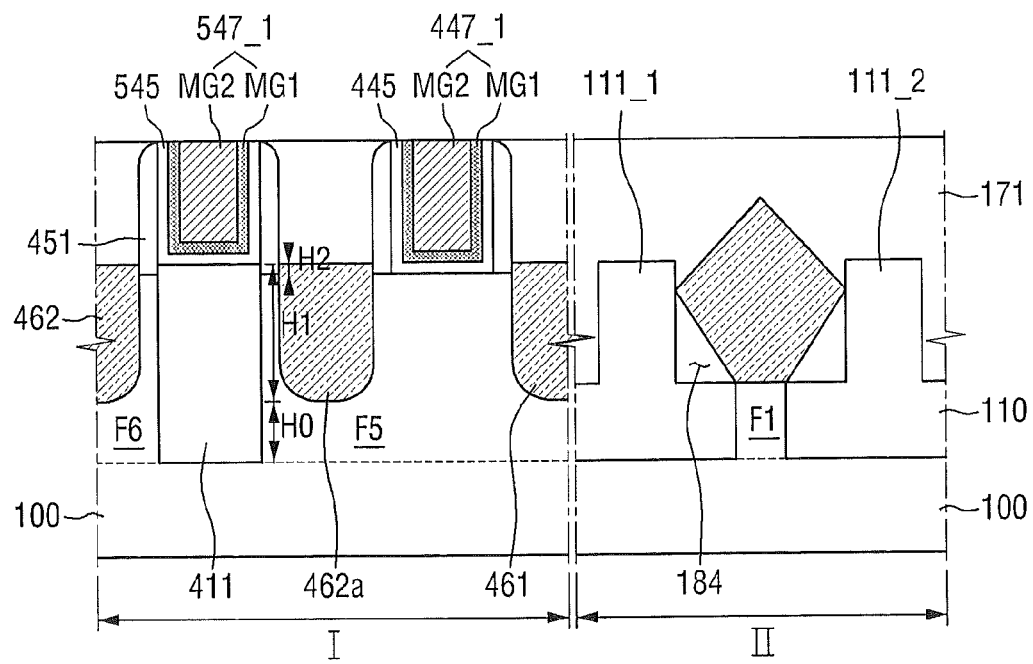
FIG. 22 is a cross-sectional view simultaneously illustrating devices formed in a first region I and a second region II.

FIG. 20 is a block diagram of a semiconductor device according to some embodiments of the present inventive concept, FIG. 21A is a perspective view illustrating a second raised field dielectric film formed in a first part shown in FIG. 20, FIG. 21B is a partially perspective view illustrating a plurality of fins and the second raised field dielectric film shown in FIG. 21A, and FIG. 22 is a cross-sectional view simultaneously illustrating devices formed in a first region I and a second region II. The cross-sectional view of FIG. 22 shown in the first region I is a cross-sectional view taken along the line G-G' of FIG. 21A.

Referring to FIG. 20, the first region I and the second region II are defined in a substrate. One of the semiconductor devices according to some embodiments of the present inventive concept discussed above with respect to FIGS. 1 to 19C may be formed in the second region II.

Devices to be discussed below may be formed in the first region I, which will now be discussed with reference to FIGS. 21A to 22.

The devices formed in the first region I may include a plurality of fins F5 to F7, a plurality of normal gates 447_1 to 447_5, a second field dielectric film 410, a plurality of dummy gates 547_1 and 547_2, and a plurality of sources/drains 461 and 462.

The plurality of fins F5 to F7 may extend lengthwise in a fifth direction Y2 to be parallel to each other. The fins F5 to F7 may be portions of a substrate 100 and may include an epitaxial layer grown from the substrate 100. In the illustrated embodiments, three fins F5 to F7 disposed lengthwise to be parallel to each other are exemplified, but aspects of the present inventive concept are not limited thereto.

In the illustrated embodiments, the fins F5 to F7 are rectangular, but aspects of the present inventive concept are not limited thereto. In other words, the fins F5 to F7 may be chamfered. In other words, corner portions may be rounded. Since the fins F5 to F7 are formed lengthwise in the fifth direction Y2, they may include long sides formed along the fifth direction Y2 and short sides formed along a fourth direction X2. Even if the corners of the fins F5 to F7 are rounded, it is obvious to one skilled in the art that the long sides can be definitely distinguished from the short sides.

The second field dielectric film 410 may be formed on the substrate 100 to surround portions of the plurality of fins F5 to F7.

In particular, the second field dielectric film 410 may include a third part 411 and a fourth part 412 having different heights. The height of the fourth part 412 may be H0, and the height of the third part 411 may be H0+H1. For example, the third part 411 may be formed to make contact with short sides of the fins F5 to F7 and the fourth part 412 may be formed to make contact with long sides of the fins F5 to F7. The third part 411 may be formed under dummy gates 547_1 and 547_2 and the fourth part 412 may be formed under normal gates 447_1 to 447_5. In other words, portions of the second field dielectric film 410 (i.e., the third part 411) may be disposed between fins opposite to and facing each other (e.g., between F5 and F6 and between F6 and F7). The third part 411 may be formed to extend lengthwise in the fourth direction X2 and the fourth part 412 may be formed to extend lengthwise in the fifth direction Y2.

Furthermore, as shown in FIG. 21B, the second field dielectric film 410 may be formed to surround terminals of the fins F5 to F7. In other words, the third part 411 may include a third first part 411a and a third_second part 411b. The third first part 411a and the third_second part 411b may have different widths. In particular, the width of the third_second part 411b may be greater than the width of the third first part 411a. As a result, the third_second part 411b may surround the terminals of the fins F5 to F7. In such a manner, it may be possible to prevent the second field dielectric film 410 and dummy gates 547_1 and 547_2 formed thereon from being misaligned.

The second field dielectric film 410 may be, for example, an oxide film, a nitride film, an oxynitride film, or a combination thereof.

The plurality of normal gates 447_1 to 447_5 may be formed on the corresponding fins F5 to F7 to intersect the corresponding fins F5 to F7. For example, the first to third normal gates 447_1, 447_2 and 447_3 may be formed on the fin F5, the fourth normal gate 447_4 may be formed on the fin F6, and the fifth normal gate 447_5 may be formed on the fin F7. The normal gates 447_1 to 447_5 may extend lengthwise in the fourth direction X2.

The plurality of dummy gates 547_1 and 547_2 may be formed on a corresponding part of the second field dielectric film 410 (i.e., the third part 411 of the second field dielectric film 410). For example, the first dummy gate 547_1 may be formed on the third part 411 shown in the left of FIG. 21A, and the second dummy gate 547_2 may be formed on the third part 411 shown in the right of FIG. 21A. In particular, each one of the dummy gates 547_1 and 547_2 may be formed on the corresponding third part 411. Since each one, instead of two or more, of the dummy gates 547_1 and 547_2 is formed, the layout size can be reduced.

Referring to FIG. 22, each normal gate (e.g., 447_1) may include metal layers MG1 and MG2. As illustrated in FIG. 22, the normal gate 447_1 may include two more metal layers MG1 and MG2 stacked one on another. The first metal layer MG1 may function to adjust a work function, and the second metal layer MG2 may function to fill a space formed by the first metal layer MG1. The normal gate 447_1 may be formed by, for example, a replacement process (or gate last process), but aspects of the present inventive concept are not limited thereto.

Each dummy gate (e.g., 547_1) may have substantially the same configuration as the normal gate 447_1. As shown, the dummy gate 547_1 may include two more metal layers MG1 and MG2 stacked one on another. As further illustrated, gate insulating films 445 and 545 are provided between sidewall spacers 451 and metal layers MG1.

Since a top surface of the third part 411 may be positioned on a level with or higher than top surfaces of the plurality of fins F5 and F6, the dummy gate 547_1 is not disposed in a space between the fin F5 and the fin F6. Therefore, sizes of a parasitic capacitor formed between the dummy gate 547_1 and the fin F5 and a parasitic capacitor formed between the dummy gate 547_1 and the fin F6 are very small. In addition, since there is little contact area between the dummy gate 547_1 and the fin F5 or between the dummy gate 547_1 and the fin F6, a very small amount of leakage current is generated.

As shown in FIG. 22, a top surface of the third part 411 of the second raised field dielectric film 410, formed in the first region I, may be positioned on a level with top surfaces of the second parts 111_1 and 111_2 of the first field dielectric films 110, 111_1 and 111_2, formed in the second region II. The first raised field dielectric films 110, 111_1 and 111_2 and the second raised field dielectric film 410 may be made of the same material. For example, the first raised field dielectric films 110, 111_1 and 111_2 and the second raised field dielectric film 410 may be formed of oxide films, for example, high density plasma (HDP) oxide films. In other words, the first raised field dielectric films 110, 111_1 and 111_2 and the second raised field dielectric film 410 may be formed using a similar process.

Figure 23:
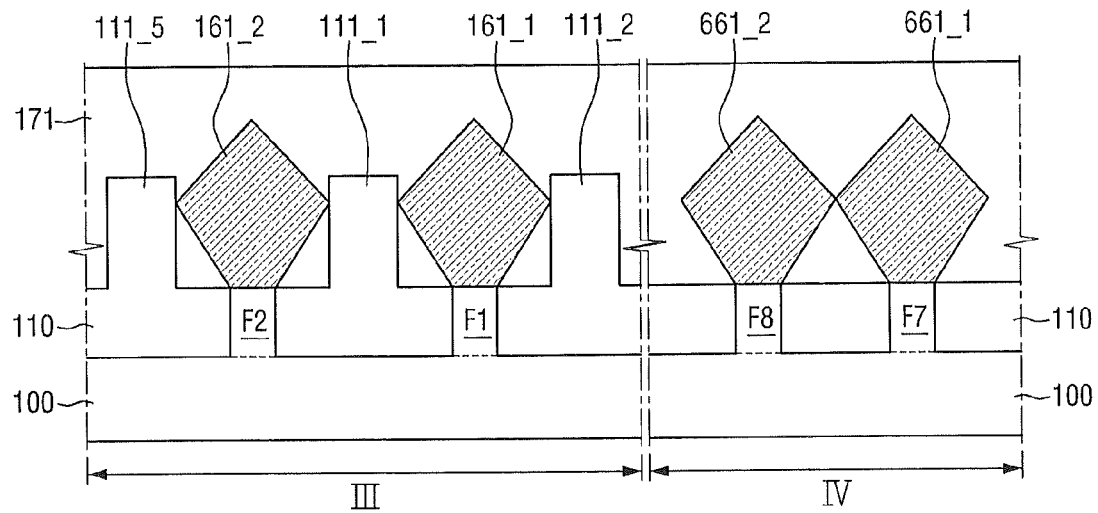
FIG. 23 is a perspective view of a semiconductor device according to some embodiments of the present inventive concept.

FIG. 23 is a perspective view of a semiconductor device according to some embodiments of the present inventive concept. In the interest of brevity, the following description will focus on differences between the present embodiment and embodiments of the present inventive concept discussed above with respect to FIGS. 8 and 9.

Referring to FIG. 23, in the semiconductor device 12 according to some embodiments of the present inventive concept, a substrate 100 has a third region III and a fourth region IV defined therein. In the third region III, the semiconductor device 5 shown in FIGS. 8 and 9 may be formed.

In the fourth region IV, a plurality of fins F7 and F8 are formed on the substrate 100. Elevated sources/drains 661_1 and 661_2 may be formed on the plurality of fins F7 and F8, respectively. In particular, the plurality of elevated sources/drains 661_1 and 661_2 may make contact with each other. The same bias may be applied to the elevated sources/drains 661_1 and 661_2. In a case where the elevated sources/drains 661_1 and 661_2 are in contact with each other, resistance levels of the elevated sources/drains 661_1 and 661_2 can be reduced.

For example, the third region III may be an SRAM forming region, and the fourth region IV may be a logic region, but aspects of the present inventive concept are not limited thereto.

Hereinafter, processing steps in the fabrication of semiconductor device according to some embodiments of the present inventive concept will be discussed with reference to FIGS. 24 to 31. FIGS. 24 to 31 illustrate intermediate processing steps for in the fabrication of semiconductor devices according to some embodiments of the present inventive concept.

Figure 24:
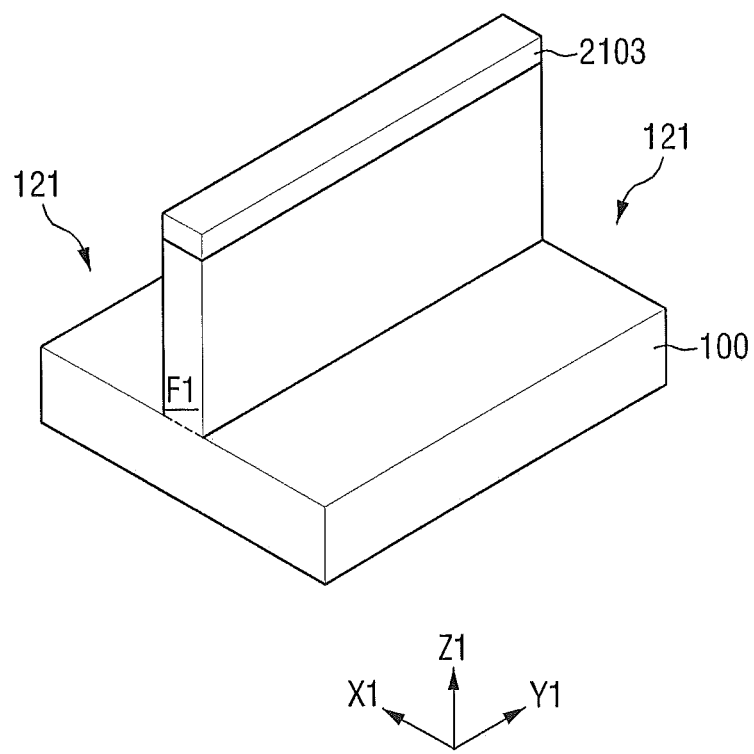
FIGS. 24 to 31 illustrate processing steps in the fabrication of a semiconductor device according to some embodiments of the present inventive concept.

Referring first to FIG. 24, a fin F1 is formed on a substrate 100. In particular, a mask pattern 2103 is formed on the substrate 100, followed by performing an etching process, thereby forming the fin F1. The fin F1 may extend in a second direction Y1. A trench 121 is formed in vicinity of the fin F1. The mask pattern 2103 may be made of a material including at least one of a silicon oxide film, a silicon nitride film and a silicon oxynitride film.

Figure 25:
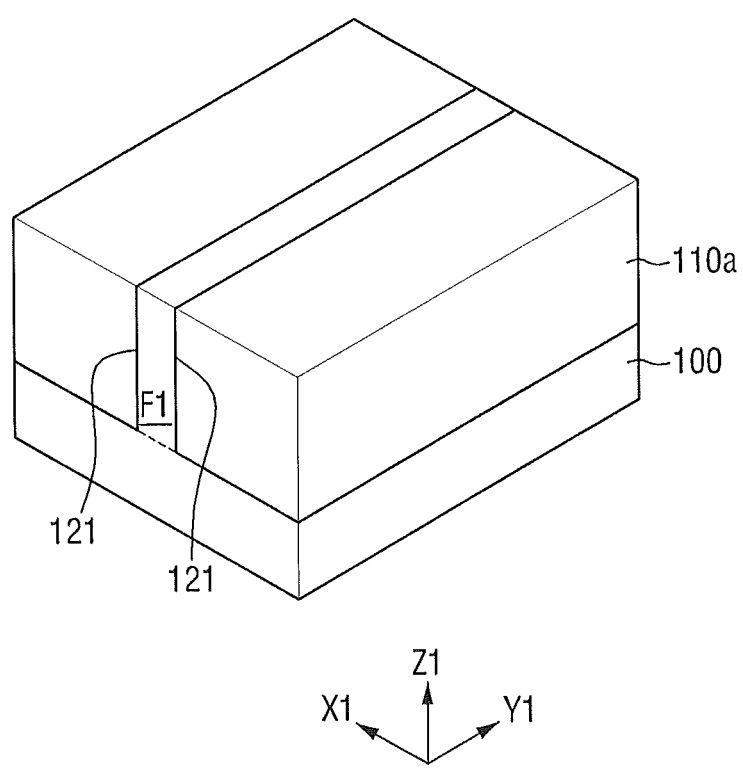

Referring to FIG. 25, an insulating film 110a filling the trench 121 is formed.

Figure 26:
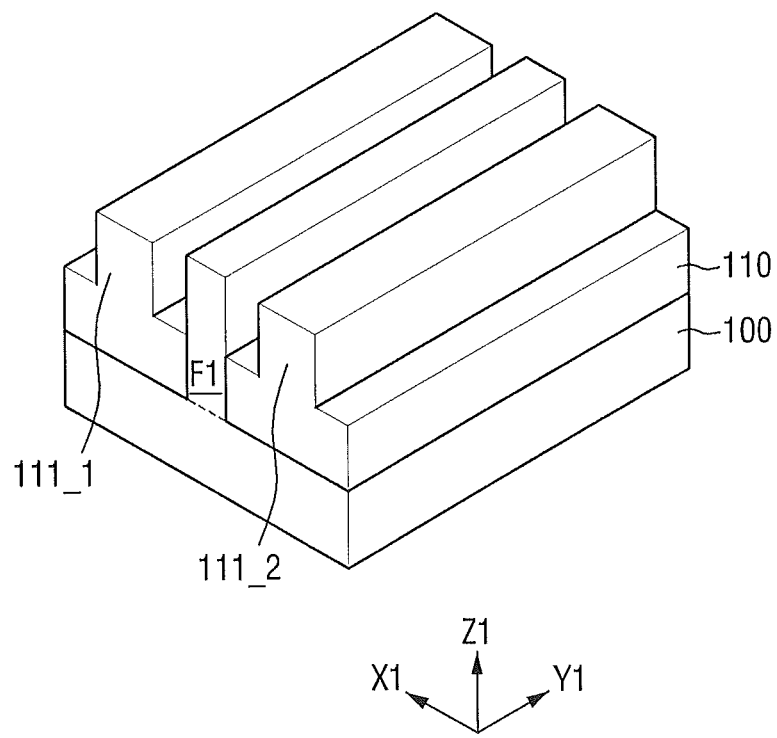

As illustrated in FIG. 26, a mask is formed on the insulating film 110a, and the insulating film 110a is etched using the mask, thereby forming first field dielectric films 110, 111_1 and 111_2.

The first field dielectric films 110, 111_1 and 111_2 may include a first part 110 positioned lower than top surfaces of the fin F1 and the second fin F2 and a plurality of second parts 111_1 and 111_2 positioned higher than the top surfaces of the fin F1 and the second fin F2. Furthermore, the first field dielectric films 110, 111_1 and 111_2 expose a top portion of the fin F1.

Impurity may be doped into the fin F1 for adjusting a threshold voltage. When a fin type transistor is an NMOS transistor, the impurity may be boron (B). When the fin type transistor is a PMOS transistor, the impurity may be phosphorus (P) or arsenic (As).

Figure 27:
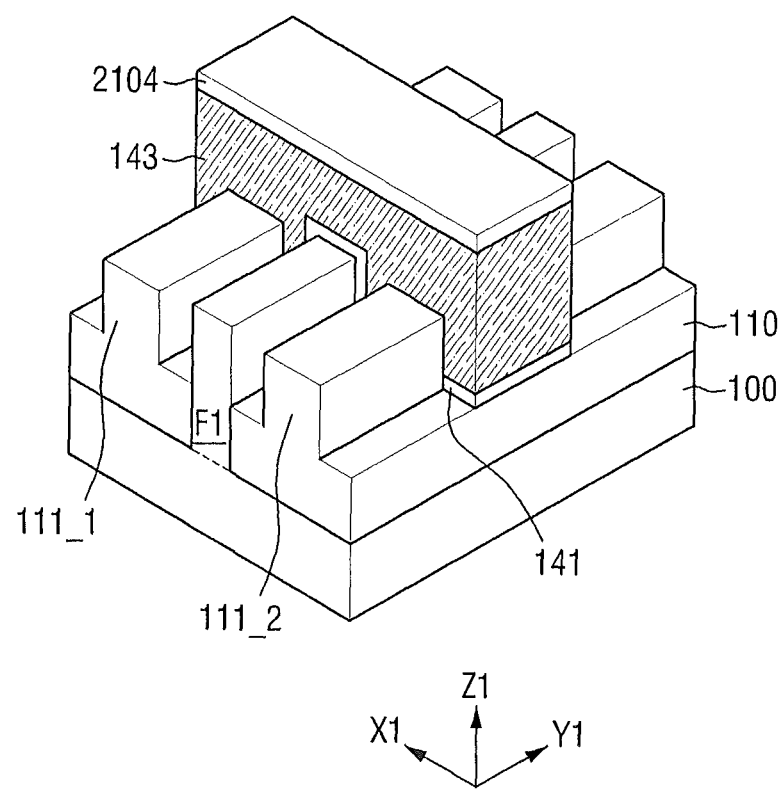

Referring to FIG. 27, an etching process is performed using a mask pattern 2104 to form a first preliminary gate insulating film 141 and a first preliminary gate electrode 143 intersecting the fin F1 and extending in a first direction X1. For example, the first preliminary gate insulating film 141 may be a silicon oxide film, and the first preliminary gate electrode 143 may be made of polysilicon.

Figure 28:
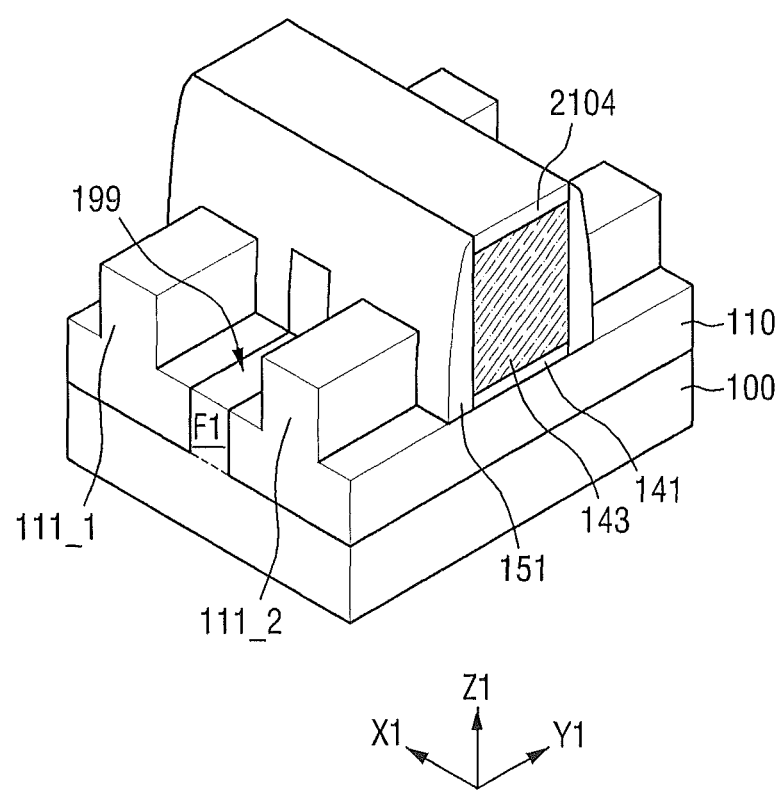

Referring to FIG. 28, a first spacer 151 may be formed on sidewalls of the first preliminary gate electrode 143 and may expose a top surface of the mask pattern 2104. The first spacer 151 may be formed of a silicon nitride film or a silicon oxynitride film.

Subsequently, a portion of the fin F1 exposed at opposite sides of the first preliminary gate electrode 143 is removed, thereby forming a recess 199.

Figure 29:
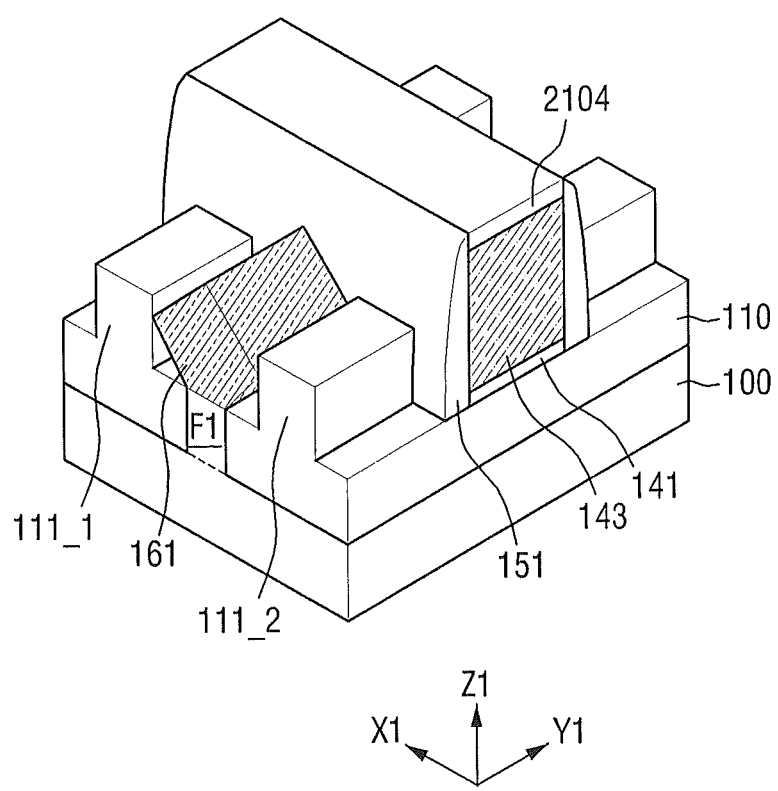

Referring to FIG. 29, a first elevated source/drain 161 is formed on the fin F1 (i.e., in the recess 199). The first elevated source/drain 161 may be formed by an epitaxial process. The material for forming the first elevated source/drain 161 may vary according to whether the semiconductor device 1 according to some embodiments of the present inventive concept is an N type transistor or a P type transistor. In addition, the impurity may be in situ doped during the epitaxial process, when necessary.

The first elevated source/drain 161 may have at least one shape of a diamond, a circle and a rectangle. In the illustrated embodiments, a diamond shaped (or pentagonal or hexagonal) first elevated source/drain 161 is exemplified in FIG. 29.

When the first elevated source/drain 161 is formed by the epitaxial process, the second parts 111_1 and 111_2 define positions where the first elevated source/drain 161 is to be formed. As will be discussed later, since the second parts 111_1 and 111_2 of the first field dielectric films 110, 111_1 and 111_2 are formed to protrude to a predetermined height, the first elevated source/drain 161 cannot spreads laterally.

In other words, the first elevated source/drain 161 may grow up to points at which it meets the second parts 111_1 and 111_2.

Therefore, the second parts 111_1 and 111_2 may make contact with the first elevated source/drain 161. Regions of the first elevated source/drain 161, where the sidewalls and top surface meet, may protrude horizontally or laterally. Therefore, the second parts 111_1 and 111_2 may make contact with the horizontally protruding region of the first elevated source/drain 161.

Figure 30:
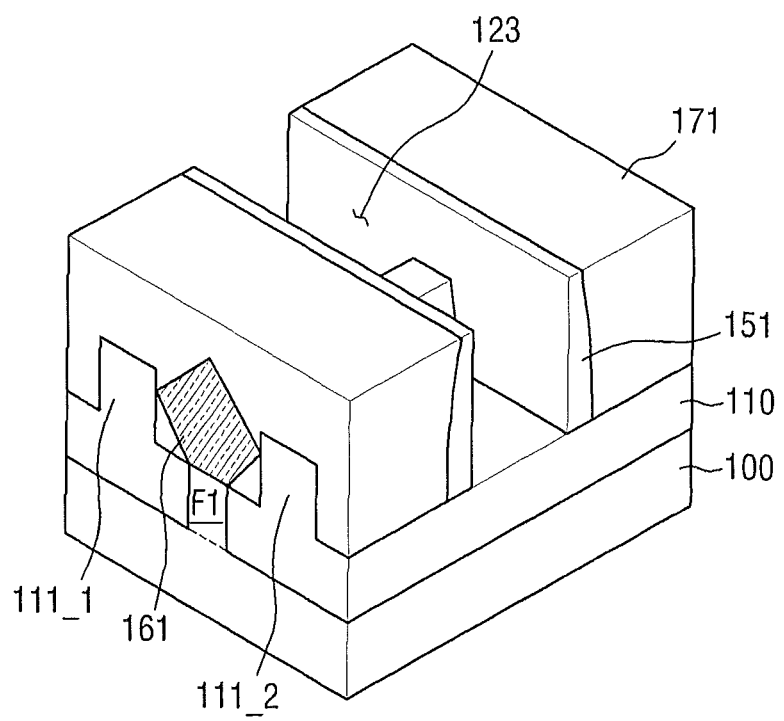

Referring to FIG. 30, an interlayer dielectric film 171 is formed on the resultant product shown in FIG. 29. The interlayer dielectric film 171 may be, for example, at least one of an oxide film, a nitride film, or an oxynitride film.

Next, the interlayer dielectric film 171 is planarized until a top surface of the first preliminary gate electrode 143 is exposed. As the result, the mask pattern 2104 is removed, and the top surface of the first preliminary gate electrode 143 is exposed.

Next, the first preliminary gate insulating film 141 and the first preliminary gate electrode 143 are removed. As the first preliminary gate insulating film 141 and the first preliminary gate electrode 143 are removed, a trench 123 exposing the field dielectric film 110 is formed.

Figure 31:
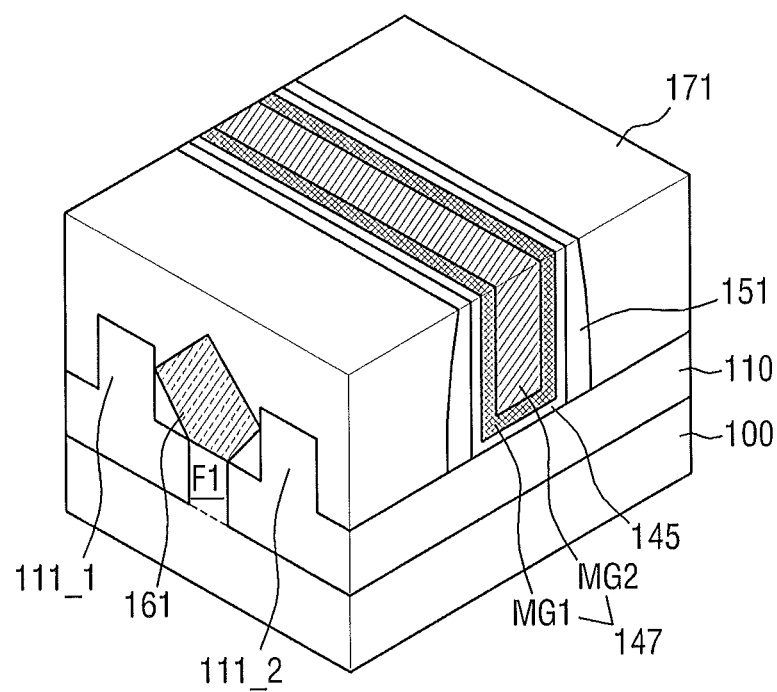

Referring to FIG. 31, a first gate electrode insulating film 145 and a first gate electrode 147 are formed in the trench 123. The first gate electrode insulating film 145 may include a high-k dielectric material having a higher dielectric constant than a silicon oxide film. The first gate electrode 147 may include metal layers MG1 and MG2.

Figure 32:
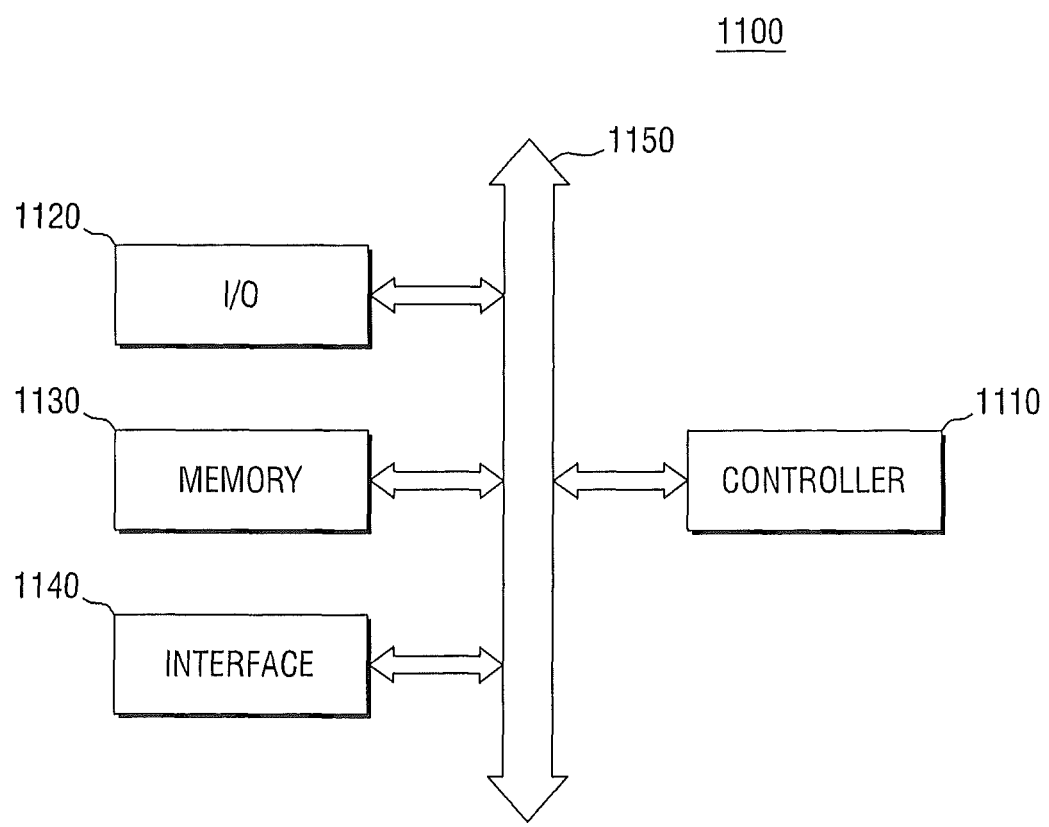
FIG. 32 is a block diagram of an electronic system including a semiconductor device according to some embodiments of the present inventive concept.

Referring now to FIGS. 1 through 23 and 32, an exemplary electronic system using semiconductor devices in accordance with embodiments discussed herein will be discussed. FIG. 32 is a block diagram of an electronic system including a semiconductor device according to some embodiments of the present inventive concept. As illustrated in FIG. 32, the electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include high-speed DRAM and/or SRAM as the operating memory for improving the operation of the controller 1110. Fin electric field effect transistors according to some embodiments of the present inventive concept may be provided in the memory 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 33:
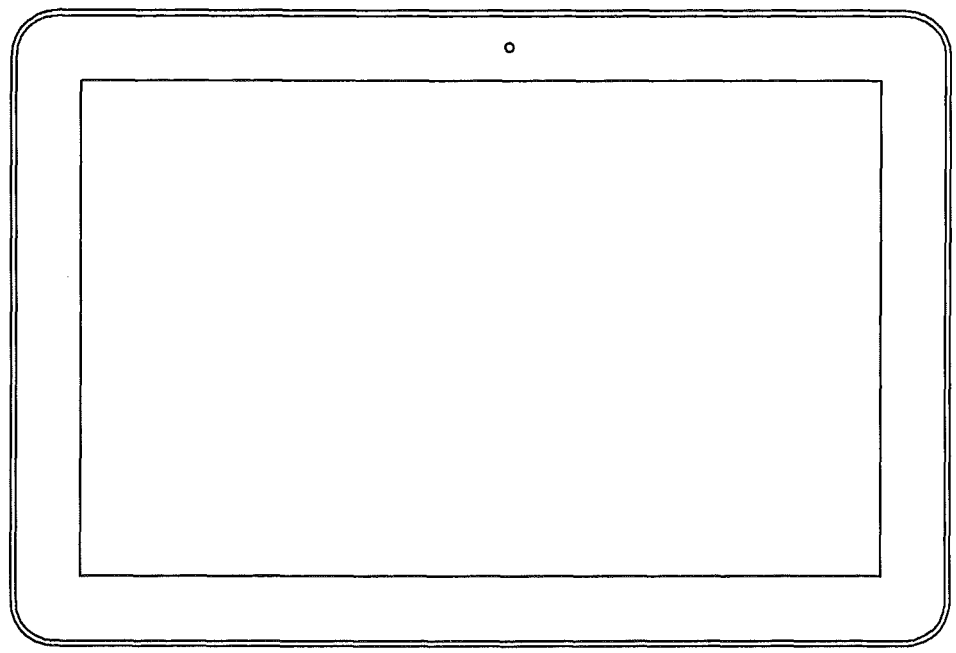
FIGS. 33 and 34 illustrate a semiconductor system for semiconductor devices according to some embodiments of the present inventive concept.
Figure 34:
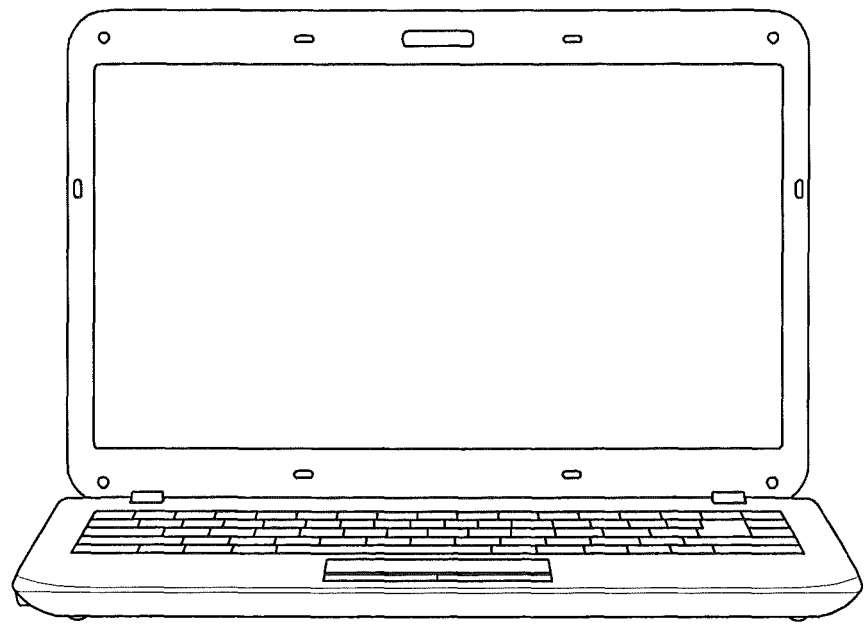

FIGS. 33 and 34 illustrate an exemplary semiconductor system to which semiconductor devices according to some embodiments of the present inventive concept can be used. FIG. 33 illustrates an example in which a semiconductor device according to some embodiments of the present inventive concept is applied to a tablet PC, and FIG. 34 illustrates an example in which a semiconductor device according to some embodiments of the present inventive concept is applied to a notebook computer. At least one of the semiconductor devices according to embodiments of the present inventive concept discussed herein can be employed to a tablet PC, a notebook computer, and the like. It is obvious to one skilled in the art that the semiconductor devices according to some embodiments of the present inventive concept may also be applied to other IC devices not illustrated herein.

While the present inventive concept has been particularly shown and discussed with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
    a first fin;
    a first gate electrode intersecting the first fin;
    a first elevated source and/or drain on respective sides of the first gate electrode on the first fin;
    a first field dielectric film adjacent the first fin, wherein the first field dielectric film includes a first part having an upper surface at or below a top surface of the first fin and a second part protruding from the first part and above a top surface of the first fin that makes contact with the first elevated source and/or drain; and
    a spacer on the first part of the field dielectric film and between the first gate electrode and the first elevated source and/or drain.

2. The semiconductor device of claim 1, wherein a width of the second part of the first field dielectric film is smaller than a width of the first part of the first field dielectric film.

3. The semiconductor device of claim 1:
    wherein the first elevated source and/or drain includes a fifth part and a sixth part, the fifth part being closer to the first fin than the sixth part;
    wherein a width of the fifth part is smaller than a width of the sixth part; and
    wherein the second part of the first field dielectric film contacts the sixth part of the first elevated source and/or drain.

4. The semiconductor device of claim 3, wherein the second part of the first field dielectric film does not contact the fifth part of the first elevated source and/or drain.

5. The semiconductor device of claim 4, further comprising an airgap between the second part of the first field dielectric film and the fifth part of the first elevated source and/or drain.

6. The semiconductor device of claim 4, further comprising an insulating material having a lower dielectric constant than the first field dielectric film between the second part of the first field dielectric film and the fifth part of the first elevated source/drain.

7. The semiconductor device of claim 3, wherein the first elevated source and/or drain is one of a diamond shape, circular and rectangular.

8. The semiconductor device of claim 1, further comprising:
    a third fin spaced apart from the first fin; and
    a second field dielectric film between the first fin and the third fin, the second field dielectric film including a third region below the first fin and an upper surface of the second fin and a fourth region protruding from the third region above the first fin and the top surface of the second fin; and
    a dummy gate on the second field dielectric film.

9. The semiconductor device of claim 8, wherein an upper surface of the second part of the first field dielectric film and an upper surface of a fourth region of the second field dielectric film are parallel.

10. A semiconductor device comprising:
    a first fin;
    a first gate electrode intersecting the first fin;
    a first elevated source and/or drain on respective sides of the first gate electrode on the first fin;
    a first field dielectric film adjacent the first fin, wherein the first field dielectric film includes a first part having an upper surface at or below a top surface of the first fin and a second part protruding from the first part and above a top surface of the first fin that makes contact with the first elevated source and/or drain;
    a second fin;
    a second gate electrode intersecting the second fin; and
    a second elevated source and/or drain on respective sides of the second gate electrode on the second fin, wherein one side of the second part of the first field dielectric film contacts the first elevated source and/or drain and the second elevated source and/or drain, respectively,
    wherein the first elevated source and/or drain and the second elevated source and/or drain have different conductivity types.

* * * * *